(12) United States Patent
Kuenemund et al.

(10) Patent No.: US 12,406,946 B2
(45) Date of Patent: Sep. 2, 2025

(54) INTEGRATED CIRCUIT FOR PREVENTION OF CIRCUIT DESIGN THEFT

(71) Applicant: Infineon Technologies AG, Neubiberg (DE)

(72) Inventors: Thomas Kuenemund, Munich (DE); Markus Gruetzner, Munich (DE); Peter Egger, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 346 days.

(21) Appl. No.: 17/163,597

(22) Filed: Feb. 1, 2021

(65) Prior Publication Data

US 2021/0272916 A1  Sep. 2, 2021

(30) Foreign Application Priority Data

Mar. 2, 2020 (DE) ............... 10 2020 105 474.2

(51) Int. Cl.
*H01L 21/70* (2006.01)
*H01L 21/336* (2006.01)
(Continued)

(52) U.S. Cl.
CPC ..... *H01L 23/573* (2013.01); *H03K 19/00315* (2013.01); *H10D 84/85* (2025.01); *H10D 89/10* (2025.01)

(58) Field of Classification Search
CPC ... H01L 27/088; H01L 27/092; H01L 23/573; H01L 27/0207; H03K 19/00315; H10D 84/85
(Continued)

(56) References Cited

U.S. PATENT DOCUMENTS 4,409,434 A   10/1983  Basset et al.
4,680,736 A * 7/1987  Schrenk ............... G07F 7/1083
                                                       365/218
(Continued)

FOREIGN PATENT DOCUMENTS

DE  102015105417 A1  10/2015
DE  102015105879 A1  10/2015
(Continued)

OTHER PUBLICATIONS

Torrance, R. et al.; "The State-of-the-Art in Semiconductor Reverse Engineering"; Proceedings of the 48th Design Automation Conference, DAC 2011; dated Jun. 2011; 33 pages; https://www.researchgate.net/publication/221058794_The_state-of-the-art_in_semiconductor_reverse_engineering (Year: 2011).*
(Continued)

*Primary Examiner* — Joshua Benitez Rosario
*Assistant Examiner* — Scott E Bauman
(74) *Attorney, Agent, or Firm* — Viering, Jentschura & Partner mbB

(57) ABSTRACT

Various embodiments describe an integrated circuit. The integrated circuit includes at least seven planar field effect transistors provided in a common substrate next to one another with a maximum feature size in accordance with a technology node of a maximum of 65 nm. Each field effect transistor of the at least seven planar field effect transistors includes a first source/drain diffusion region, a second source/drain diffusion region, a channel region between the drain diffusion region and the source diffusion region, and a gate terminal. Each field effect transistor of the at least seven planar field effect transistors includes at least one common source/drain diffusion region with another field effect transistor of the at least seven planar field effect transistors. The
(Continued)

common source/drain diffusion regions are free of vertical terminal contact material.

13 Claims, 19 Drawing Sheets

(51) Int. Cl.
  *H01L 23/00* (2006.01)
  *H03K 19/003* (2006.01)
  *H10D 84/85* (2025.01)
  *H10D 89/10* (2025.01)

(58) Field of Classification Search
  USPC .................. 438/128–129, 279; 257/206, 390
  See application file for complete search history.

(56) References Cited

U.S. PATENT DOCUMENTS

| | | | |
|---|---|---|---|
| 4,716,308 A | 12/1987 | Matsuo et al. | |
| 5,783,846 A | 7/1998 | Baukus et al. | |
| 5,866,933 A | 2/1999 | Baukus et al. | |
| 5,977,790 A * | 11/1999 | Sanwo | H03K 19/00361 |
| | | | 327/170 |
| 6,005,270 A * | 12/1999 | Noguchi | H01L 27/11543 |
| | | | 257/30 |
| 6,037,636 A * | 3/2000 | Crippen | H10D 89/811 |
| | | | 257/357 |
| 7,471,113 B1 * | 12/2008 | Lim | H03K 19/0008 |
| | | | 326/87 |
| 9,330,763 B1 * | 5/2016 | Zhang | G11C 16/26 |
| 9,337,156 B2 | 5/2016 | Kuenemund et al. | |
| 9,385,726 B2 | 7/2016 | Kuenemund et al. | |
| 9,431,352 B2 | 8/2016 | Kuenemund et al. | |
| 9,496,872 B1 | 11/2016 | Kuenemund | |
| 9,548,737 B1 | 1/2017 | Kuenemund et al. | |
| 9,806,881 B2 | 10/2017 | Kuenemund et al. | |
| 2004/0056280 A1 | 3/2004 | Murata et al. | |
| 2005/0263815 A1 * | 12/2005 | Park | H10D 30/6891 |
| | | | 257/315 |
| 2014/0293702 A1 * | 10/2014 | Dong | H10B 41/10 |
| | | | 365/185.17 |
| 2018/0091155 A1 * | 3/2018 | Kuenemund | H03K 19/00315 |
| 2018/0174985 A1 * | 6/2018 | Kuenemund | G06F 21/72 |
| 2018/0182794 A1 * | 6/2018 | Go | H10F 39/011 |
| 2020/0411453 A1 * | 12/2020 | Lu | H01L 27/0207 |
| 2021/0257363 A1 * | 8/2021 | Kuenemund | H10D 84/0172 |

FOREIGN PATENT DOCUMENTS

| | | |
|---|---|---|
| DE | 102015110431 A1 | 12/2015 |
| DE | 102016113128 A1 | 1/2017 |
| DE | 102016121449 A1 | 5/2018 |

OTHER PUBLICATIONS

Kleindiek Nanotechnik GMBH; 2019; https://web.archive.org/web/20191215171345/https://www.nanotechnik.com/ps8.html*

Torrance, R. et al.; "The State-of-the-Art in IC Reverse Engineering"; Proceedings of the 11th International Workshop on Cryptographic Hardware and Embedded Systems, dated 2009; pp. 363-381; Springer Verlag; Lausanne, Switzerland. https://www.iacr.org/archive/ches2009/57470361/57470361.pdf (Year: 2009).*

German Office Action issued for corresponding DE application 10 2020 105 474.2 dated Nov. 4, 2020, 8 pages (for informational purposes only).

Office Action for corresponding German Patent Application No. 10 2020 105 474.2, dated May 8, 2023, 7 pages (for Informational purposes only).

Torrance, R. et al.; "The State-of-the-Art in Semiconductor Reverse Engineering"; Proceedings of the 48th Design Automation Conference, DAC 2011; dated Jun. 2011; 33 pages; San Diego, California, USA.

Rajendran, J. et al.; "Security Analysis of Integrated Circuit Camouflaging"; Proceedings of the 2013 ACM SIGSAC conference on Computer & communications security, CCS'13; dated Nov. 2013; 12 pages; Berlin, Germany.

* cited by examiner

INTEGRATED CIRCUIT FOR PREVENTION OF CIRCUIT DESIGN THEFT

CROSS-REFERENCE TO RELATED APPLICATION

This application claims priority to German Patent Application Serial No. 10 2020 105 474.2, which was filed Mar. 2, 2020, and is incorporated herein by reference in its entirety.

TECHNICAL FIELD

Various embodiments relate to an integrated circuit.

BACKGROUND

Data theft, reverse engineering and reconstruction of integrated circuits are regarded as one of the greatest threats or dangers in the semiconductor industry since reverse engineering for example can abused in order to steal and/or to copy a circuit design (for example by reconstruction). By way of example, the stolen circuit design can be used to produce and sell similar (for example copied) integrated circuits, to use and/or sell the circuit design, to disclose the design to competitors, etc. For all these reasons it may be necessary to develop concepts and methods which hinder or prevent theft of a circuit design or of a circuit technology.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
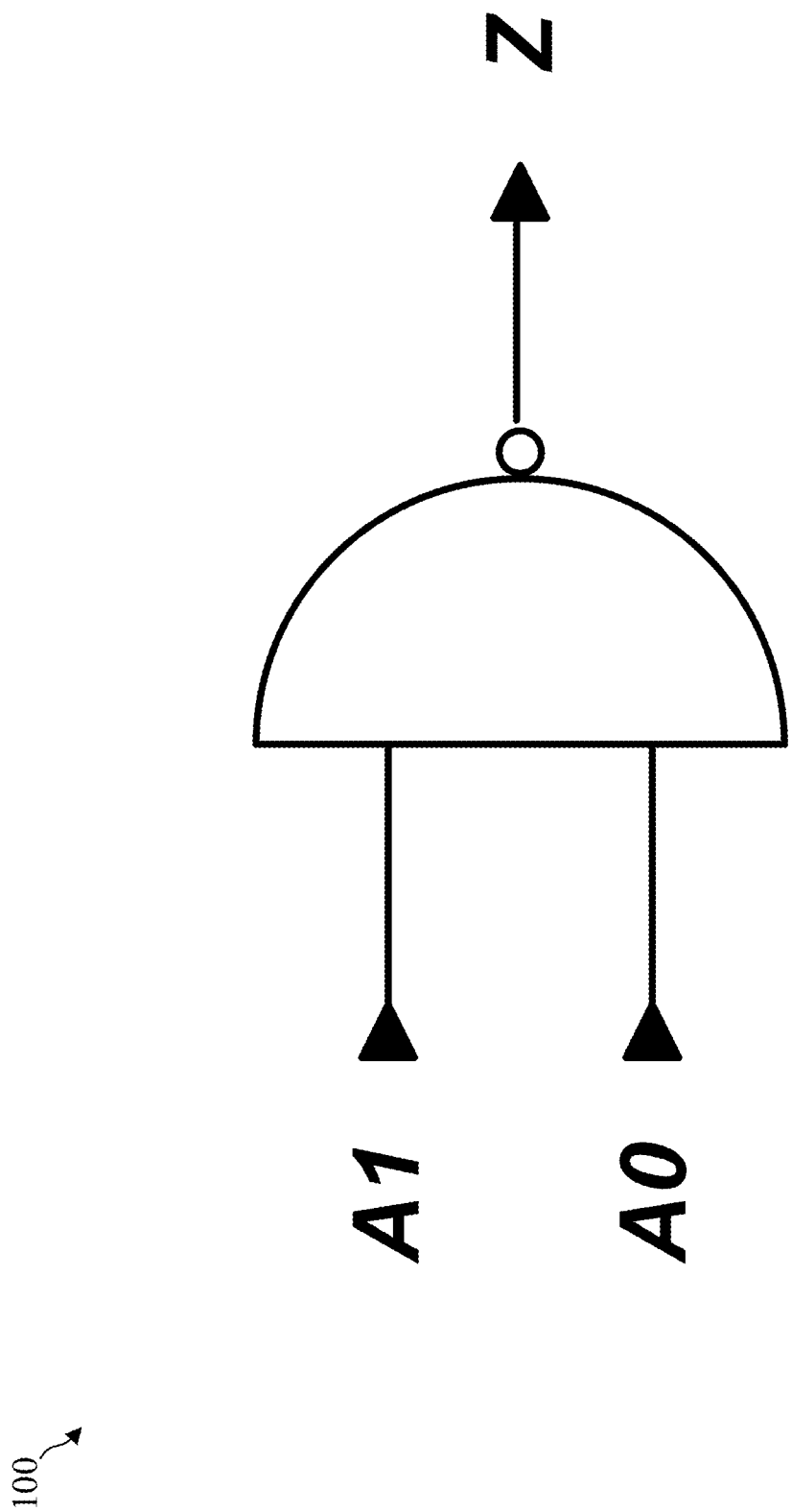
FIG. 1 shows a schematic illustration of a NAND logic gate.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since components of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. The term "connected" can mean electrically connected, for example. In the figures, identical or similar elements are provided with identical reference signs, insofar as this is expedient.

The design of an integrated circuit may afford a crucial advantage vis-à-vis competitors, for example by virtue of the arrangement (for example of transistors), by virtue of various characteristics of transistors, by virtue of selected threshold values (for example voltage threshold values), etc. By means of reverse engineering of an integrated circuit, the design (such as, for example, the transfer properties of the transistors) of the integrated circuit may be stolen and for example sold and/or used. An integrated circuit in accordance with various embodiments is described below. The integrated circuit may include a plurality of transistors and the transistors can be arranged or coupled in such a way that analyzing the properties of the switching elements is hindered, for example prevented.

An integrated circuit in various embodiments for a NAND-based circuit is described below. It is pointed out that the integrated circuit can be any type of integrated circuit in which transistors are interconnected to form logic circuits, such as, for example, a NOR-based circuit, an AND-NOR-based circuit or an OR-NAND-based circuit, etc.

FIG. 1 shows a schematic illustration of a NAND logic gate 100. A NAND (NOT AND) logic gate may include a first input A1 and a second input A0. The NAND logic gate may furthermore include an output Z. The NAND (NOT AND) logic gate can be described by the Boolean equation Z=NAND (A1, A0) or Z=NOT (A1*A0).

Figure 2A:
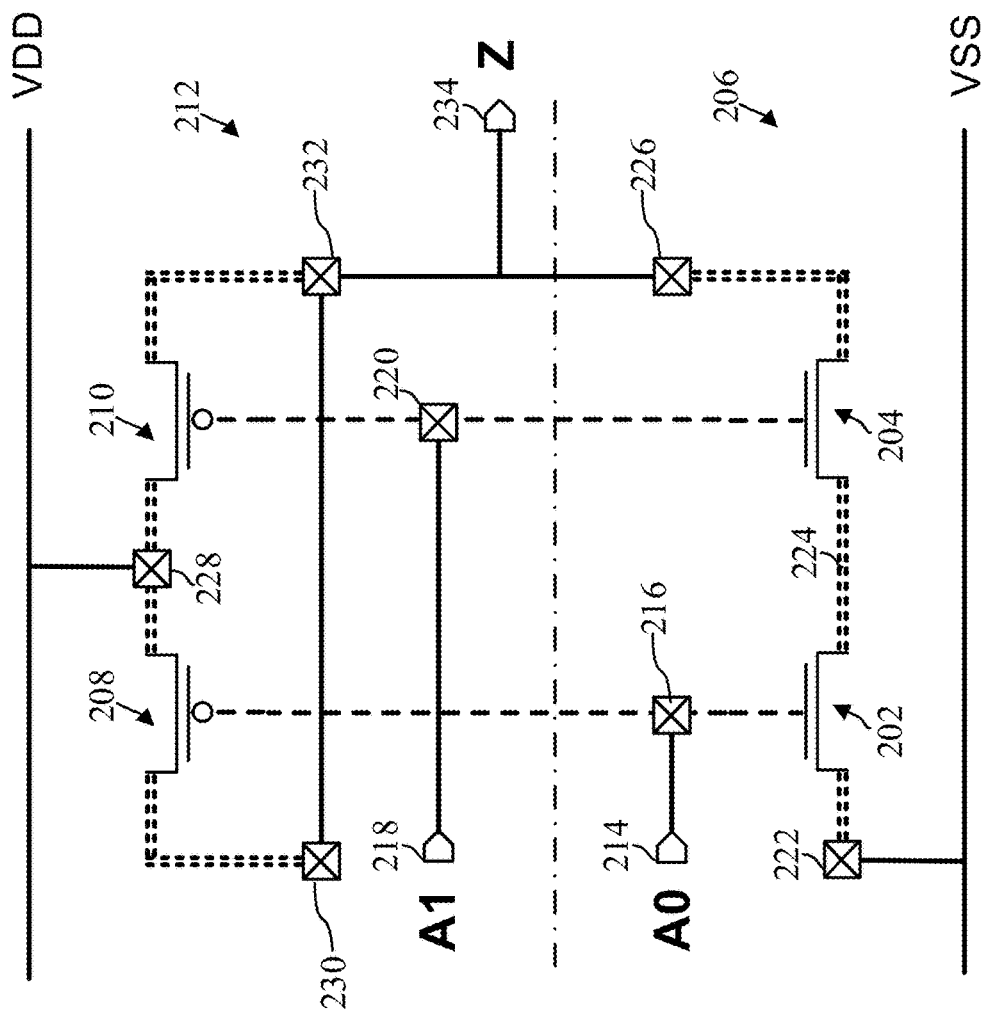
FIG. 2A shows a NAND-based integrated circuit in accordance with various embodiments.

FIG. 2A shows a NAND-based integrated circuit 200 in accordance with various embodiments. The integrated circuit 200 may include a first field effect transistor 202. The first field effect transistor 202 can be an n-channel field effect transistor. It is pointed out that all field effect transistors described herein for example can be MOSFETs (metal oxide semiconductor field effect transistors) and can be formed by means of CMOS (complementary metal oxide semiconductor) technology. The integrated circuit 200 may include a second field effect transistor 204. The second field effect transistor 204 can be an n-channel field effect transistor. The first field effect transistor 202 and/or the second field effect transistor 204 can be arranged in a p-doped well 206. The p-doped well 206 may include silicon, for example, which is doped (for example implanted) with an element having 3 valence electrons. The integrated circuit 200 may furthermore include a third field effect transistor 208. The third field effect transistor 208 can be a p-channel field effect transistor. The integrated circuit 200 may include a fourth field effect transistor 210. The fourth field effect transistor 210 can be a p-channel field effect transistor. The third field effect transistor 208 and/or the fourth field effect transistor 210 can be arranged in an n-doped well 212. The n-doped well 212 may include silicon, for example, which is doped (for example implanted) with an element having five valence electrons. The first field effect transistor 202, the second field effect transistor 204, the third field effect transistor 206 and the fourth field effect transistor 208 may include a first source/drain diffusion region, a second source/drain diffusion region, a channel region between the drain diffusion region and the source diffusion region, and a gate terminal. It is pointed out that, unless explicitly indicated otherwise, each field effect transistor described below may include a first source/drain diffusion region, a second source/drain diffusion region, a channel region between the drain diffusion region and the source diffusion region, and a gate terminal. Furthermore, it is pointed out, that unless specifically indicated otherwise, each integrated circuit described below may include one or more metallization planes for electrically contacting the field effect transistors contained in the substrate. The field effect transistors can be electrically contacted by means of contacts composed of vertical terminal contact material.

The integrated circuit 200 may include a first input 214 (for example the input A0 of the NAND logic gate 100). The first input 214 can be connected to the gate terminal of the first field effect transistor (FET) 202 by means of a first gate contact 216. The first input 214 can furthermore be connected to the gate terminal of the third FET 208 by means of the first gate contact 216. It is pointed out that, unless explicitly indicated otherwise, each contact (for example gate contact, for example source contact, for example drain contact) described below may include a vertical terminal composed of vertical terminal contact material.

The vertical terminal contact material may include or substantially consist of a metal, such as, for example, tungsten, aluminum, gold, silver, copper, etc., or a metal alloy. Furthermore, it is pointed out that if a contact (for example gate contact, for example source contact, for example drain contact) described below is connected to an input, an output and/or some other contact (for example more than one other contact), the contact can be connected to the input, the output and/or the other contact by means of a metal layer.

The integrated circuit 200 may include a second input 218 (for example the input A1 of the NAND logic gate 100). The second input 218 can be connected to the gate terminal of the second FET 204 by means of a second gate contact 220. The second input 218 can furthermore be connected to the gate terminal of the fourth FET 210 by means of the second gate contact 220.

The integrated circuit 200 may include a first source contact 222. The first source contact 222 can be connected to the source diffusion region of the first FET 202. The first source contact 222 can be connected to a low supply potential VSS.

The integrated circuit 200 may include a common source/drain diffusion region 224. The common source/drain diffusion region 224 can be a common source/drain diffusion region of the first FET 202 and of the second FET 204. The common source/drain diffusion region 224 can be connected to a drain terminal of the first FET 202. The common source/drain diffusion region 224 can be connected to a source terminal of the second FET 204. The integrated circuit 200 may include a first drain contact 226. The first drain contact 226 can be connected to the drain diffusion region of the second FET 204.

The integrated circuit 200 may include a common source contact 228. The common source contact 228 can be connected to the source diffusion region of the third FET 208. The common source contact 228 can furthermore be connected to the source diffusion region of the fourth FET 210. The common source contact 228 can be connected to a high supply potential VDD.

The integrated circuit 200 may include a second drain contact 230. The second drain contact 230 can be connected to the drain diffusion region of the third FET 208. The integrated circuit 200 may include a third drain contact 232. The third drain contact 232 can be connected to the drain diffusion region of the fourth FET 210. The third drain contact 232 can be connected to the second drain contact 230.

The integrated circuit 200 may include an output 234 (for example the output Z of the NAND logic gate 100). In accordance with various embodiments, the first drain contact 226 and the third drain contact 232 can be connected to the output 234.

Figure 2B:
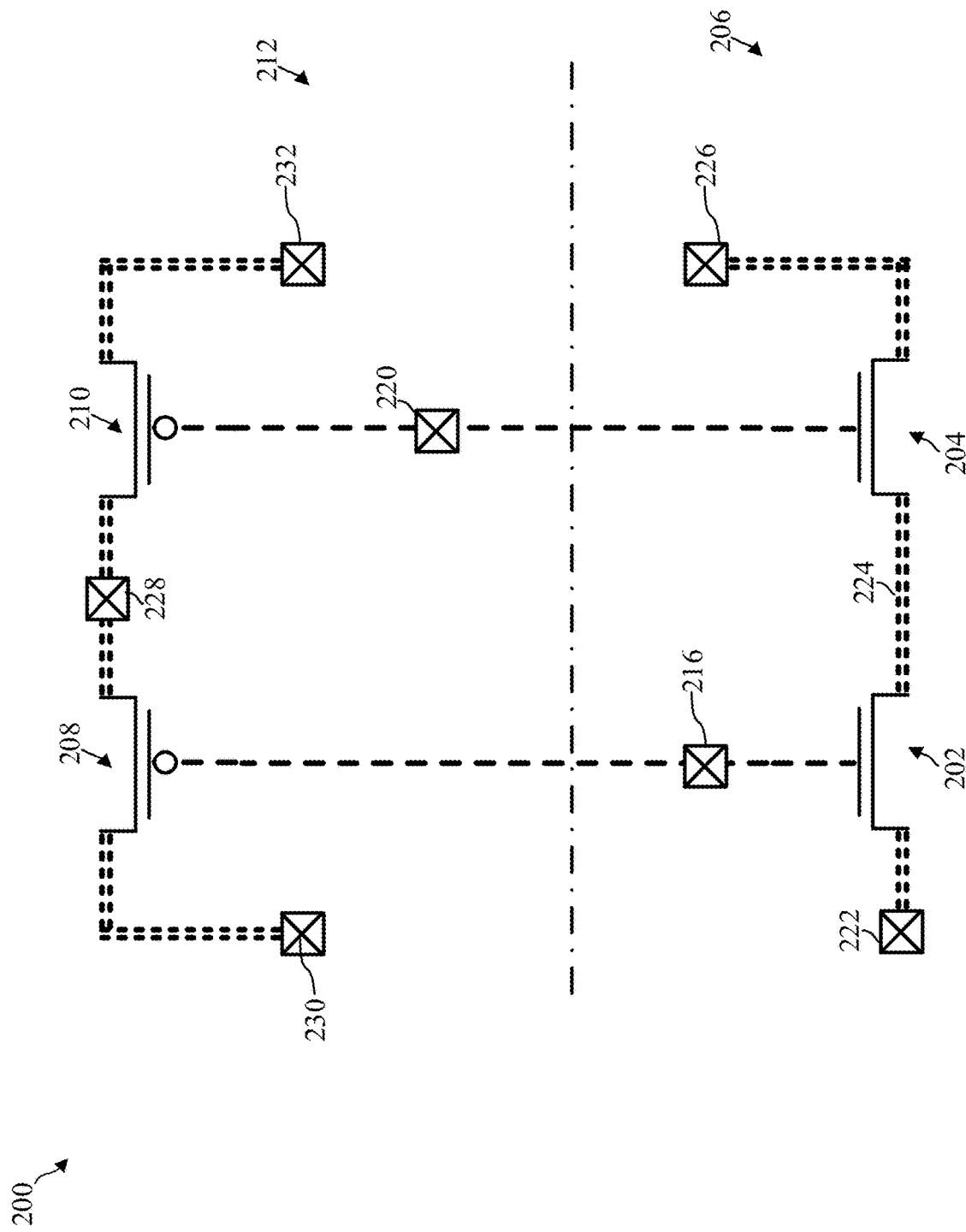
FIG. 2B shows a contact plane of a NAND-based integrated circuit in accordance with various embodiments.

FIG. 2B shows a contact plane of the NAND-based integrated circuit 200 in accordance with various embodiments. The contact plane of the integrated circuit 200 can be exposed for example by removal (for example by means of chemical etching, for example by means of physical etching) of layers (for example metal and insulation layers) of the integrated circuit. This may be necessary for example for analyzing transfer properties of the field effect transistors (for example determining threshold voltages).

By way of example, in various nano-examination methods, the gate contact, the source contact and the drain contact of an individual field effect transistor can be contacted (for example by means of a plurality of examination needles) and properties of the field effect transistor can be analyzed. With regard to the integrated circuit 200 illustrated in FIG. 2B, analyzing properties of the third FET 208 for example necessitates contacting the first gate contact 216, the common source contact 228 and the second drain contact 230. In this example, three examination needles are necessary for analyzing properties of the third FET 208. In order to analyze properties of the first FET 202 or of the second FET 204, it is necessary to contact the first gate contact 216, the first source contact 222, the second gate contact 220 and the first drain contact 226. Consequently, in this example, four examination needles are necessary for analyzing properties of the first FET 202 or of the second FET 204. Consequently, as the number of field effect transistors arranged next to one another (for example connected in series) increases, the number of necessary examination needles increases in order to analyze properties of an individual field effect transistor of the field effect transistors arranged next to one another (for example connected in series). The number of available examination needles is limited on account of various factors, such as, for example, the limited number of examination needles in commercially available examination systems, on account of the reliability and the reproducibility of the positioning of the individual examination needles (for example in relation to one another), on account of space limitations owing to other devices of the examination system, on account of problems in relation to the alignment of a plurality of examination needles, etc.

In accordance with various embodiments, an integrated circuit is described below in which a plurality of field effect transistors are connected in such a way that the number required for analyzing properties of an individual field effect transistor is increased (for example is greater than the number of examination needles present in commercially available examination systems).

Figure 3:
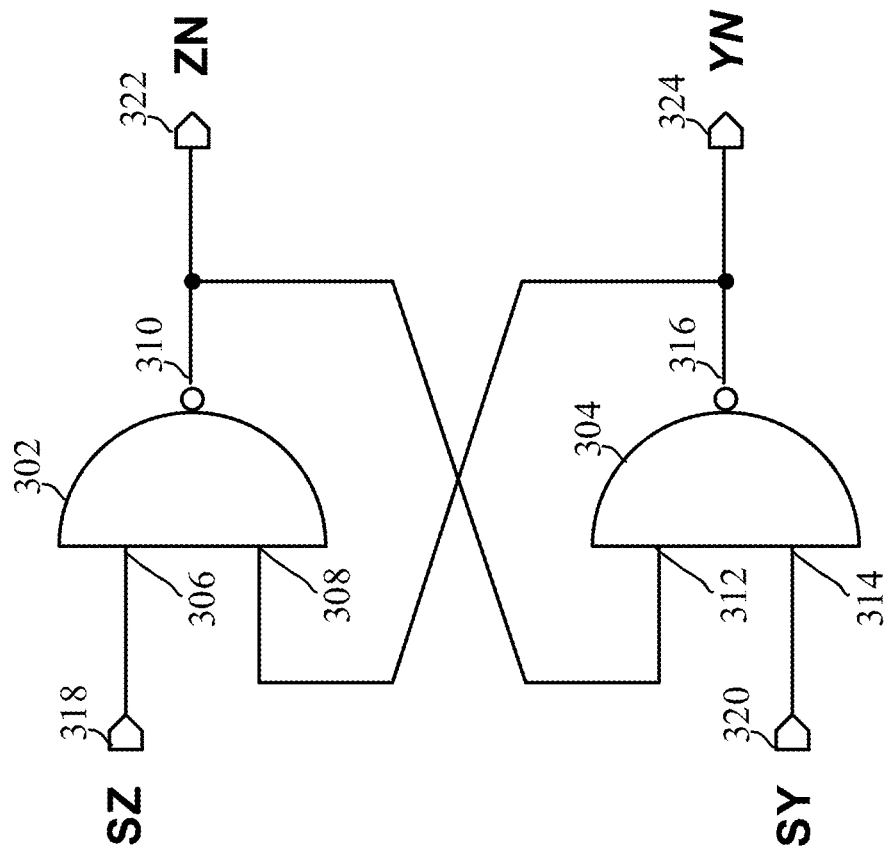
FIG. 3 shows a schematic illustration of a NAND-based RS flip-flop.

FIG. 3 shows a schematic illustration of a NAND-based RS flip-flop 300. The NAND-based RS flip-flop (RS-FF) 300 may include a first NAND logic gate 302 and a second NAND logic gate 304. The first NAND logic gate 302 may include a first input contact 306, a second input contact 308 and an output contact 310. The second NAND logic gate 304 may include a first input contact 312, a second input contact 314 and an output contact 316. The NAND-based RS-FF 300 may include a first input 318 (SZ). The first input 318 can be connected to the first input contact 306 of the first NAND logic gate. The NAND-based RS-FF 300 may include a second input 320 (SY). The second input 320 can be connected to the second input contact 314 of the second NAND logic gate. The NAND-based RS-FF 300 may include a first output 322 (ZN). The first output 322 can be connected to the output contact 310 of the first NAND logic gate 302. The first output 322 can furthermore be connected to the first input contact 312 of the second NAND logic gate 304. The NAND-based RS-FF 300 may include a second output 324 (YN). The second output 324 can be connected to the output contact 316 of the second NAND logic gate 304. The second output 324 can furthermore be connected to the second input contact 308 of the first NAND logic gate 302.

Figure 4:
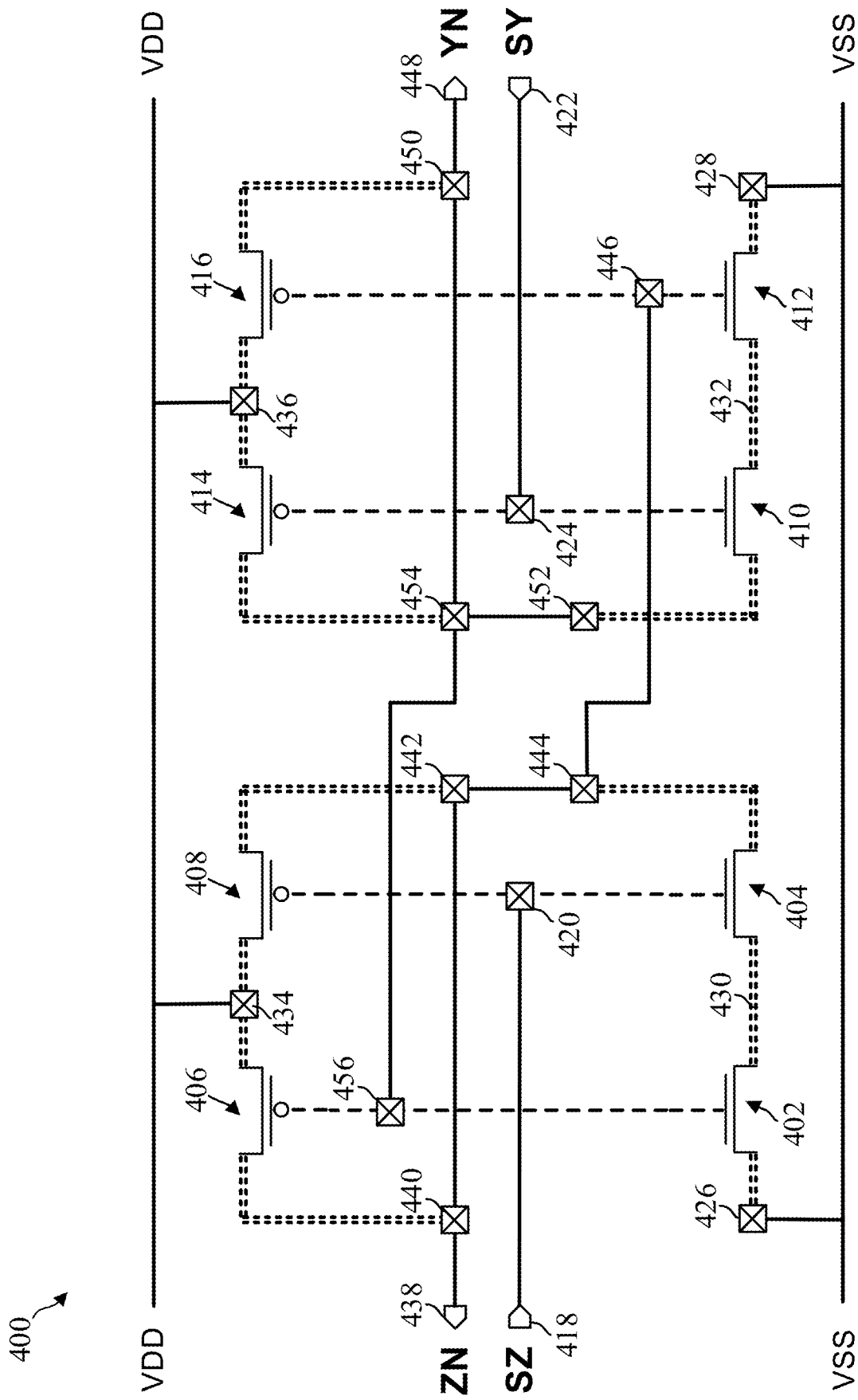
FIG. 4 shows an integrated circuit which realizes a NAND-based RS flip-flop, in accordance with various embodiments.

FIG. 4 shows an integrated circuit 400 which realizes a NAND-based RS flip-flop, in accordance with various embodiments.

The integrated circuit 400 may include a first field effect transistor 402. The first field effect transistor 402 can be an n-channel field effect transistor. The integrated circuit 400 may include a second field effect transistor 404. The second field effect transistor 404 can be an n-channel field effect transistor. The first field effect transistor 402 and/or the second field effect transistor 404 can be arranged in a p-doped well. The integrated circuit 400 may include a third field effect transistor 406. The third field effect transistor 406 can be a p-channel field effect transistor. The integrated circuit 400 may include a fourth field effect transistor 408. The fourth field effect transistor 408 can be a p-channel field effect transistor. The third field effect transistor 406 and/or the fourth field effect transistor 408 can be arranged in an n-doped well.

The integrated circuit 400 may include a fifth field effect transistor 410. The fifth field effect transistor 410 can be an n-channel field effect transistor. The integrated circuit 400 may include a sixth field effect transistor 412. The sixth field effect transistor 412 can be an n-channel field effect transistor. The fifth field effect transistor 410 and/or the sixth field effect transistor 412 can be arranged in a p-doped well. The integrated circuit 400 may furthermore include a seventh field effect transistor 414. The seventh field effect transistor 414 can be a p-channel field effect transistor. The integrated circuit 400 may include an eighth field effect transistor 416. The eighth field effect transistor 416 can be a p-channel field effect transistor. The seventh field effect transistor 414 and/or the eighth field effect transistor 416 can be arranged in an n-doped well.

The integrated circuit 400 may include a first input 418 (for example the input SZ of the NAND-based RS-FF 300). The first input 418 can be connected to the gate terminal of the second FET 404 by means of a first gate contact 420. The first input 418 can furthermore be connected to the gate terminal of the fourth FET 408 by means of the first gate contact 420.

The integrated circuit 400 may include a second input 422 (for example the input SY of the NAND-based RS-FF 300). The second input 422 can be connected to the gate terminal of the fifth FET 410 by means of a second gate contact 424. The second input 422 can furthermore be connected to the gate terminal of the seventh FET 414 by means of the second gate contact 424.

The integrated circuit 400 may include a first source contact 426. The first source contact 426 can be connected to the source diffusion region of the first FET 402. The first source contact 426 can be connected to a low supply potential VSS. The integrated circuit 400 may include a second source contact 428. The second source contact 428 can be connected to the source diffusion region of the sixth FET 412. The second source contact 428 can be connected to the low supply potential VSS.

The integrated circuit 400 may include a first common source/drain diffusion region 430. The first common source/drain diffusion region 430 can be a common source/drain diffusion region of the first FET 402 and of the second FET 404. The first common source/drain diffusion region 430 can be connected to the drain terminal of the first FET 402. The first common source/drain diffusion region 430 can be connected to the source terminal of the second FET 404.

The integrated circuit 400 may include a second common source/drain diffusion region 432. The second common source/drain diffusion region 432 can be a common source/drain diffusion region of the fifth FET 410 and of the sixth FET 412. The second common source/drain diffusion region 432 can be connected to the drain terminal of the sixth FET 412. The second common source/drain diffusion region 432 can be connected to the source terminal of the fifth FET 410.

The integrated circuit 400 may include a first common source contact 434. The first common source contact 434 can be connected to the source diffusion region of the third FET 406. The first common source contact 434 can furthermore be connected to the source diffusion region of the fourth FET 408. The first common source contact 434 can be connected to a high supply potential VDD.

The integrated circuit 400 may include a second common source contact 436. The second common source contact 436 can be connected to the source diffusion region of the seventh FET 414. The second common source contact 436 can furthermore be connected to the source diffusion region of the eighth FET 416. The second common source contact 436 can be connected to the high supply potential VDD.

The integrated circuit 400 may include a first output 438 (for example the output ZN of the NAND-based RS-FF 300). The first output 438 can be connected to a first drain contact 440. The first drain contact 440 can be connected to the drain diffusion region of the third FET 406. The integrated circuit 400 may furthermore include a second drain contact 442. The second drain contact 442 can be connected to the drain diffusion region of the fourth FET 408. The second drain contact 442 can furthermore be connected to the first drain contact 440. The integrated circuit 400 may furthermore include a third drain contact 444. The third drain contact 444 can be connected to the drain diffusion region of the second FET 404. The third drain contact 444 can furthermore be connected to the second drain contact 442. The third drain contact 444 can furthermore be connected to a third gate contact 446. The third gate contact 446 can be connected to the gate terminal of the sixth FET 412. The third gate contact 446 can furthermore be connected to the gate terminal of the eighth FET 416.

The integrated circuit 400 may include a second output 448 (for example the output YN of the NAND-based RS-FF 300). The second output 448 can be connected to a fourth drain contact 450. The fourth drain contact 450 can be connected to the drain diffusion region of the eighth FET 416. The integrated circuit 400 may furthermore include a fifth drain contact 452. The fifth drain contact 452 can be connected to the drain diffusion region of the fifth FET 410. The integrated circuit 400 may furthermore include a sixth drain contact 454. The sixth drain contact 454 can be connected to the drain diffusion region of the seventh FET 414. The sixth drain contact 454 can furthermore be connected to the fourth drain contact 450. The sixth drain contact 454 can furthermore be connected to the fifth drain contact 452. The sixth drain contact 454 can furthermore be connected to a fourth gate contact 456. The fourth gate contact 456 can be connected to the gate terminal of the first FET 402. The fourth gate contact 456 can furthermore be connected to the gate terminal of the third FET 406.

The first FET 402 and the second FET 404, which can be connected in series by means of the first common source/drain diffusion region 430, can have substantially the same transfer properties (for example transconductance). The fifth FET 410 and the sixth FET 412, which can be connected in series by means of the second common source/drain diffusion region 432, can have substantially the same transfer properties (for example transconductance), wherein the transfer properties of the fifth FET 410 and of the sixth FET 412 can be different than the transfer properties of the first FET 402 and of the second FET 404. The signal provided at the first output 438 can be dependent on whether the transconductance of the first FET 402 and of the second FET 404 is greater than the transconductance of the fifth FET 410 and of the sixth FET 412 or whether the transconductance of the first FET 402 and of the second FET 404 is less than the transconductance of the fifth FET 410 and of the sixth FET 412. The signal provided at the second output 448 can be dependent on whether the transconductance of the first FET 402 and of the second FET 404 is greater than the transconductance of the fifth FET 410 and of the sixth FET 412 or whether the transconductance of the first FET 402 and of the second FET 404 is less than the transconductance of the fifth FET 410 and of the sixth FET 412.

In order to analyze the electronic properties of the first FET 402 or of the second FET 404, it is necessary to contact the fourth gate contact 456, the first source contact 426, the first gate contact 420 and the third drain contact 444. Consequently, in this example, four examination needles are necessary for detecting the electronic properties of the first FET 402 or of the second FET 404. Consequently, as the number of field effect transistors connected next to one another (for example in series) increases, the number of necessary examination needles increases in order to analyze properties of an individual field effect transistor of the field effect transistors connected next to one another (for example in series).

As described with reference to FIG. 2B, in order to detect properties of a field effect transistor, the number of necessary examination needles increases with the number of field effect transistors connected in series.

A plurality of field effect transistors can be connected in series for example in such a way that the source terminal of a first field effect transistor of the plurality of field effect transistors is connected to a source contact and that the drain terminal of the first field effect transistor is connected to a source terminal of a second field effect transistor by means of a common source/drain diffusion region, that the drain terminal of a third field effect transistor of the plurality of field effect transistors is connected to a drain contact and that the drain terminal of the third field effect transistor is connected to a drain terminal of a fourth field effect transistor by means of a common source/drain diffusion region. The plurality of field effect transistors can furthermore be connected in series in such a way that additional field effect transistors are connected between the second field effect transistor and the fourth field effect transistor, wherein each field effect transistor of the additional field effect transistors may include a first common source/drain diffusion region with a first adjacent field effect transistor, and a second common source/drain diffusion region with a second adjacent field effect transistor (different than the first adjacent field effect transistor). Furthermore, the gate terminal of each of the plurality of field effect transistors can be connected to a gate contact.

Figure 5:
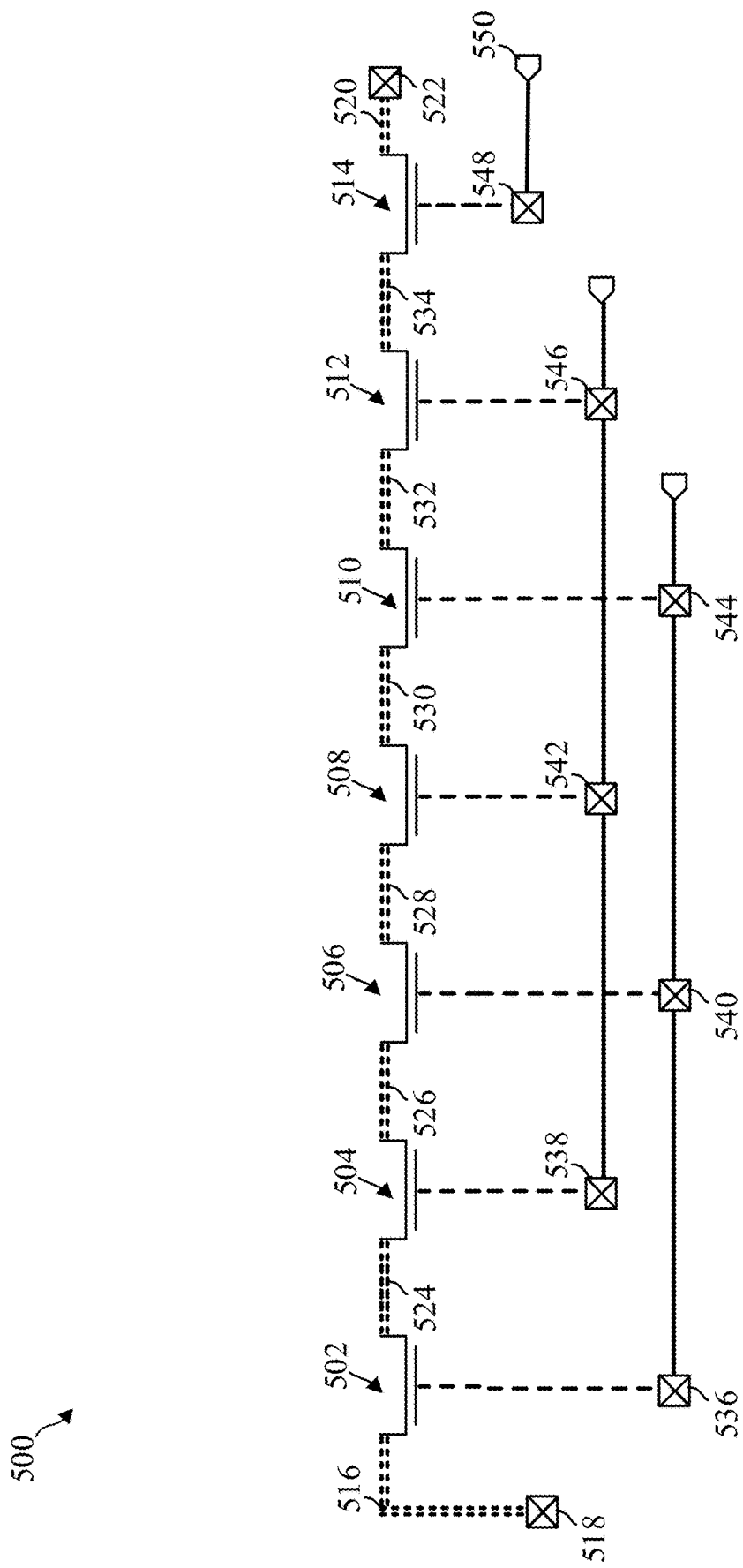
FIG. 5 shows an integrated circuit in accordance with various embodiments.

FIG. 5 shows an integrated circuit 500 in accordance with various embodiments. The integrated circuit 500 may include a plurality of field effect transistors. By way of example, the integrated circuit 500 may include at least seven (for example planar) field effect transistors (for example exactly seven field effect transistors, for example more than seven field effect transistors).

The plurality of field effect transistors (for example the at least seven planar field effect transistors) can be provided next to one another. The plurality of field effect transistors can be provided next to one another in a common substrate. The plurality of field effect transistors can be provided next to one another with a maximum feature size in accordance with a technology node of a maximum of 65 nm. The plurality of field effect transistors provided next to one another can be connected in series, for example.

Each field effect transistor of the plurality of field effect transistors may include a first source/drain diffusion region, a second source/drain diffusion region, a channel region between the drain diffusion region and the source diffusion region, and a gate terminal.

Furthermore, by way of example, each field effect transistor of the plurality of field effect transistors may include at least one common source/drain diffusion region with another field effect transistor of the plurality of field effect transistors. Each common source/drain diffusion region of the plurality of common source/drain diffusion regions can be free of vertical terminal contact material. By way of example, it is possible for each common source/drain diffusion region of the plurality of common source/drain diffusion regions not to be contacted by means of a source contact and not to be contacted by means of a drain contact.

By way of example, two field effect transistors of the plurality of field effect transistors may each include a source/drain diffusion region with a vertical terminal connected thereto and composed of vertical terminal contact material for electrically contacting the respective source/drain diffusion region. The respective source/drain diffusion region with a vertical terminal connected thereto and composed of vertical terminal contact material can be different than the plurality of common source/drain diffusion regions, for example.

The vertical terminal contact material may include or substantially consist of a metal, such as, for example, tungsten, aluminum, gold, silver, copper, etc., or a metal alloy.

By way of example, a first field effect transistor of the two field effect transistors may include a source contact (drain contact) and a second field effect transistor of the two field effect transistors may include a drain contact (source contact).

In accordance with various embodiments, the gate terminal of each field effect transistor of the plurality of field effect transistors may include a vertical terminal connected thereto and composed of vertical terminal contact material for electrically contacting the respective gate terminal. By way of example, the gate terminal of each field effect transistor of the plurality of field effect transistors may include a gate contact.

In accordance with the embodiment illustrated by way of example in FIG. 5, the integrated circuit 500 includes seven field effect transistors provided next to one another. In accordance with various embodiments, each field effect transistor of the seven field effect transistors can be an n-channel field effect transistor. In accordance with various embodiments, each field effect transistor of the seven field effect transistors can be a p-channel field effect transistor.

The integrated circuit may include a first FET 502, a second FET 504, a third FET 506, a fourth FET 508, a fifth FET 510, a sixth FET 512 and a seventh FET 514. The source diffusion region 516 of the first FET 502 can be connected to a source contact 518, for example. The source contact 518 can be a vertical terminal connected to the source diffusion region 516 and composed of vertical terminal contact material for electrically contacting the source diffusion region 516. The drain diffusion region 520 of the seventh FET 514 can be connected to a drain contact 522, for example. The drain contact 522 can be a vertical terminal connected to the drain diffusion region 520 and composed of vertical terminal contact material for electrically contacting the drain diffusion region 520.

The first FET 502 and the second FET 504 may include a first common source/drain diffusion region 524. The first common source/drain diffusion region 524 can be connected to the drain terminal of the first FET 502 and can be connected to the source terminal of the second FET 504. The first common source/drain diffusion region 524 can be free of vertical terminal contact material. By way of example, the first common source/drain diffusion region 524 may include neither a source contact nor a drain contact.

The second FET 504 and the third FET 506 may include a second common source/drain diffusion region 526. The second common source/drain diffusion region 526 can be connected to the drain terminal of the second FET 504 and can be connected to the source terminal of the third FET 506. The second common source/drain diffusion region 526 can be free of vertical terminal contact material.

The third FET 506 and the fourth FET 508 may include a third common source/drain diffusion region 528. The third common source/drain diffusion region 528 can be connected to the drain terminal of the third FET 506 and can be connected to the source terminal of the fourth FET 508. The third common source/drain diffusion region 528 can be free of vertical terminal contact material.

The fourth FET 508 and the fifth FET 510 may include a fourth common source/drain diffusion region 530. The fourth common source/drain diffusion region 530 can be connected to the drain terminal of the fourth FET 508 and can be connected to the source terminal of the fifth FET 510. The fourth common source/drain diffusion region 530 can be free of vertical terminal contact material.

The fifth FET 510 and the sixth FET 512 may include a fifth common source/drain diffusion region 532. The fifth common source/drain diffusion region 532 can be connected to the drain terminal of the fifth FET 510 and can be connected to the source terminal of the sixth FET 512. The fifth common source/drain diffusion region 532 can be free of vertical terminal contact material.

The sixth FET 512 and the seventh FET 514 may include a sixth common source/drain diffusion region 534. The sixth common source/drain diffusion region 534 can be connected to the drain terminal of the sixth FET 512 and can be connected to the source terminal of the seventh FET 514. The sixth common source/drain diffusion region 534 can be free of vertical terminal contact material.

The gate terminal of each field effect transistor of the seven field effect transistors 502, 504, 506, 508, 510, 512, 514 can each be connected to a gate contact. Each gate contact of the plurality of gate contacts can be a vertical terminal connected to the gate terminal and composed of vertical terminal contact material for electrically contacting the gate terminal. By way of example, the integrated circuit 500 may include a first gate contact 536 connected to the gate terminal of the first FET 502. By way of example, the integrated circuit 500 may include a second gate contact 538 connected to the gate terminal of the second FET 504. By way of example, the integrated circuit 500 may include a third gate contact 540 connected to the gate terminal of the third FET 506. By way of example, the integrated circuit 500 may include a fourth gate contact 542 connected to the gate terminal of the fourth FET 508. By way of example, the integrated circuit 500 may include a fifth gate contact 544 connected to the gate terminal of the fifth FET 510. By way of example, the integrated circuit 500 may include a sixth gate contact 546 connected to the gate terminal of the sixth FET 512. By way of example the integrated circuit 500 may include a seventh gate contact 548 connected to the gate terminal of the seventh FET 514.

In accordance with various embodiments, the third gate contact 540 can be connected to the first gate contact 536 by way of M1 (the first metallization layer). The third gate contact 540 can furthermore be connected to the fifth gate contact 544. In accordance with various embodiments, the fourth gate contact 542 can be connected to the second gate contact 538. The fourth gate contact 542 can furthermore be connected to the sixth gate contact 546. The seventh gate contact 548 can be connected to an input 550 of the integrated circuit 500.

The plurality of field effect transistors (for example the seven field effect transistors 502, 504, 506, 508, 510, 512, 514) can be part of a NAND-based circuit, of a NOR-based circuit, of an AND-NOR-based circuit, of an OR-NAND circuit, etc. By way of example, the plurality of field effect transistors can form a NAND-based circuit, a NOR-based circuit, an AND-NOR-based circuit, an OR-NAND-based circuit, etc. In accordance with various embodiments, the plurality of field effect transistors (for example the seven field effect transistors 502, 504, 506, 508, 510, 512, 514) can be part of an RS flip-flop. By way of example, the plurality of field effect transistors can be part of a NAND-based RS flip-flop, of a NOR-based RS flip-flop, of an AND-NOR-based RS flip-flop, of an OR-NAND-based RS flip-flop, etc.

Figure 6A:
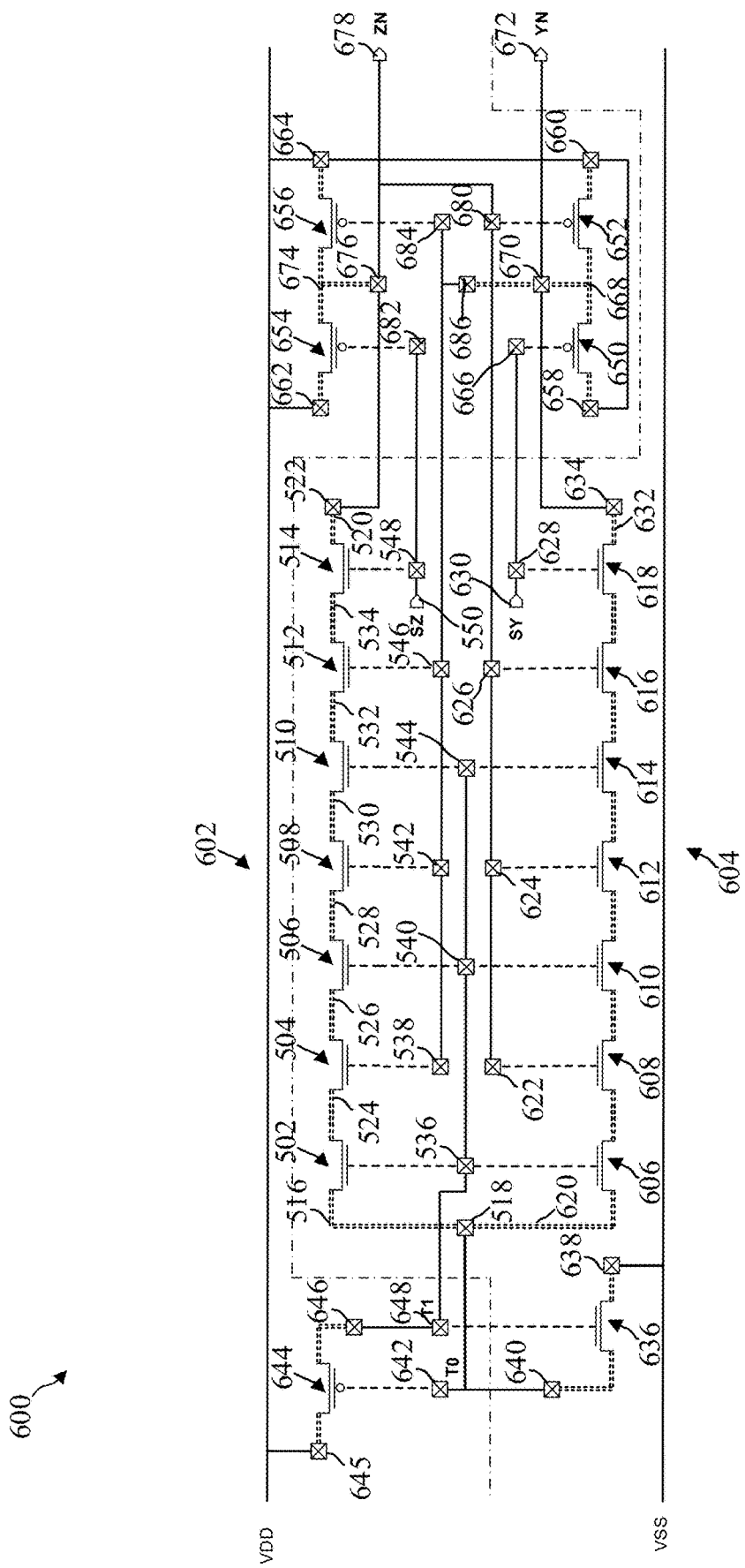
FIG. 6A shows an integrated circuit which realizes a NAND-based RS flip-flop, in accordance with various embodiments.
Figure 6B:
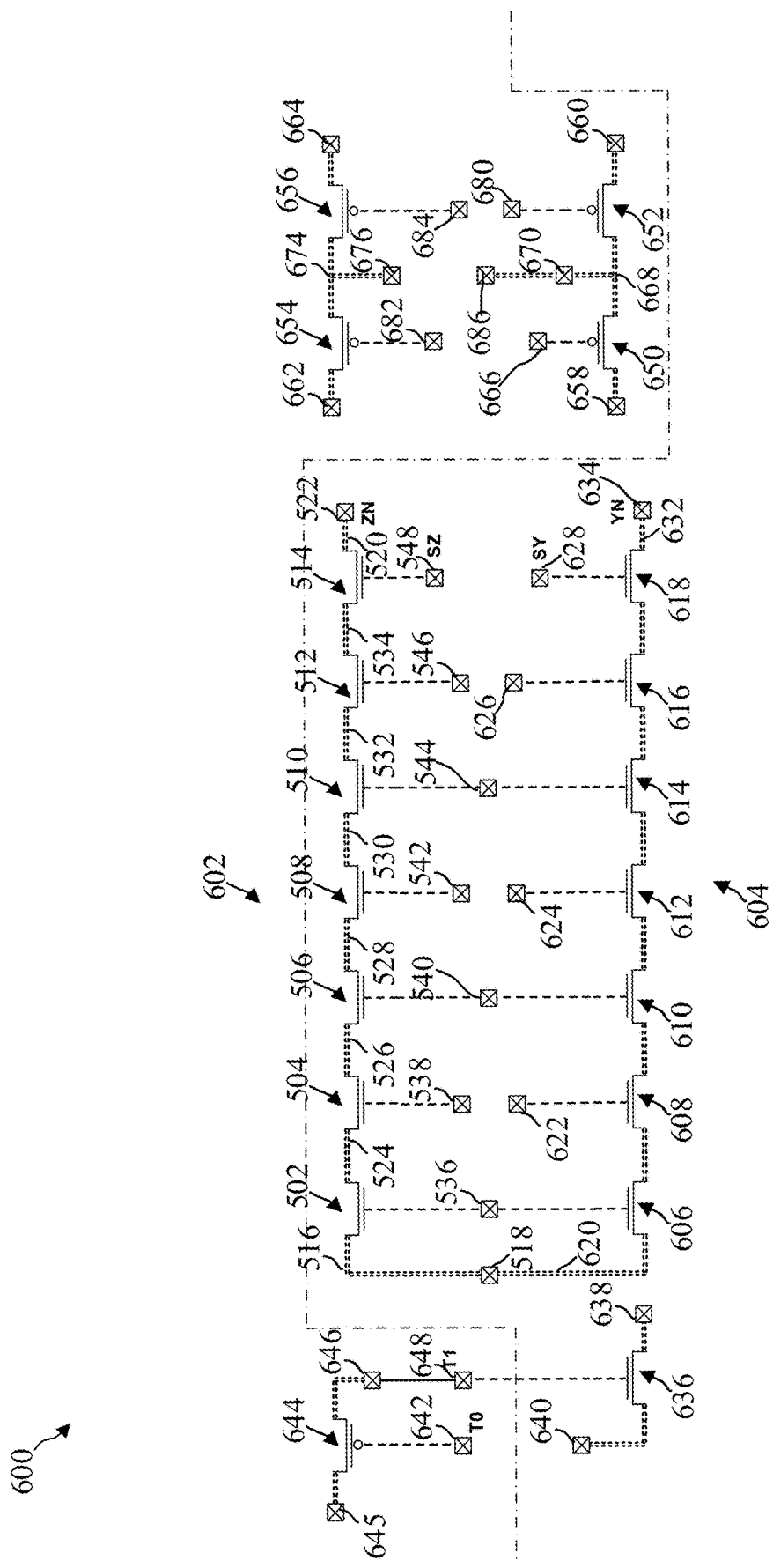
FIG. 6B shows a contact plane of an integrated circuit which realizes a NAND-based RS flip-flop, in accordance with various embodiments.
Figure 6C:
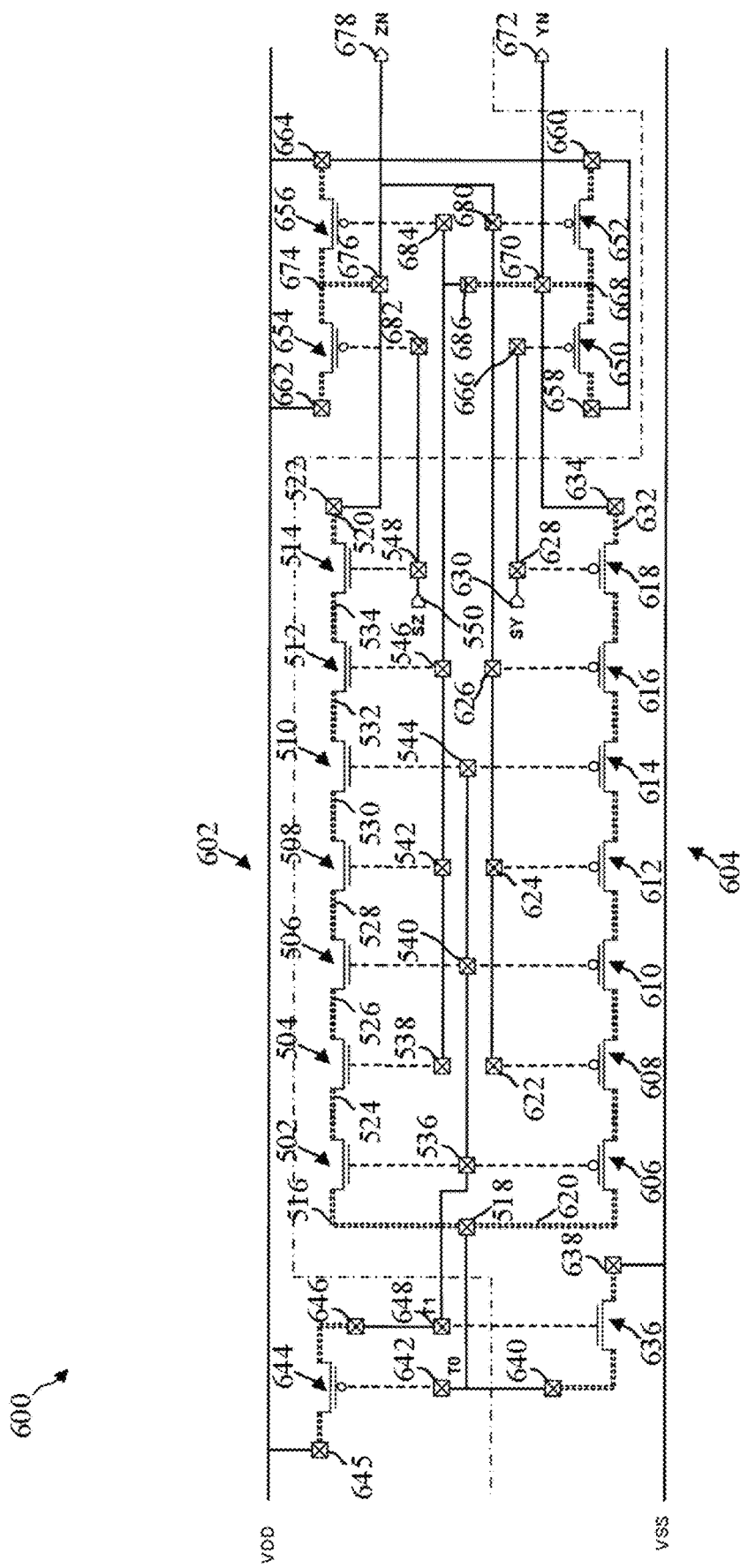
FIG. 6C shows an integrated circuit which realizes a NAND-based RS flip-flop, in accordance with various embodiments.

FIGS. 6A and 6C both show an integrated circuit 600 which realizes a NAND-based RS flip-flop, in accordance with various embodiments.

The integrated circuit 600 may include a first group of field effect transistors 602. The first group of field effect transistors 602 may include a plurality of field effect transistors. By way of example, the first group of field effect transistors 602 may include at least seven (for example planar) field effect transistors (for example exactly seven field effect transistors, for example more than seven field effect transistors). The integrated circuit 600 may furthermore include a second group of field effect transistors 604. The second group of field effect transistors 604 may include a plurality of field effect transistors. By way of example, the second group of field effect transistors 604 may include at least seven (for example planar) field effect transistors (for example exactly seven field effect transistors, for example more than seven field effect transistors). In accordance with various embodiments, the number of field effect transistors of the first group of field effect transistors 602 corresponds to the number of field effect transistors of the second group of field effect transistors 604.

The plurality of field effect transistors of the first group of field effect transistors 602 can be MOSFETs (metal oxide semiconductor field effect transistors). The plurality of field effect transistors of the first group of field effect transistors 602 (for example the at least seven planar field effect transistors) can be provided next to one another. The plurality of field effect transistors of the first group of field effect transistors 602 can be provided next to one another in a common substrate. The substrate may include or substantially consist of a semiconductor material or a semiconductor composite material. The substrate may include or substantially consist of a semiconductor material or a semiconductor composite material which is selected from a group of materials consisting of: silicon, silicon carbide, gallium arsenide, gallium nitride, etc. The plurality of field effect transistors of the first group of field effect transistors 602 can be provided next to one another with a maximum feature size in accordance with a technology node of a maximum of 65 nm. The plurality of field effect transistors provided next to one another in the first group of field effect transistors 602 can be connected in series, for example.

The plurality of field effect transistors of the second group of field effect transistors 604 can be MOSFETs (metal oxide semiconductor field effect transistors). The plurality of field effect transistors of the second group of field effect transistors 604 (for example the at least seven planar field effect transistors) can be provided next to one another. The plurality of field effect transistors of the second group of field effect transistors 604 can be provided next to one another in a common substrate. The substrate may include or substantially consist of a semiconductor material or a semiconductor composite material. The substrate may include or substantially consist of a semiconductor material or a semiconductor composite material which is selected from a group of materials consisting of: silicon, silicon carbide, gallium arsenide, gallium nitride, etc. The plurality of field effect transistors of the second group of field effect transistors 604 can be provided next to one another with a maximum feature size in accordance with a technology node of a maximum of 65 nm. The plurality of field effect transistors provided next to one another in the second group of field effect transistors 604 can be connected in series, for example.

In accordance with various embodiments, at least some of the field effect transistors of the first group of field effect transistors 602 can have a different nominal transconductance than at least some of the field effect transistors of the second group of field effect transistors 604.

The field effect transistors of the first group of field effect transistors 602 can have a first conductivity type. Some of the field effect transistors of the second group of field effect transistors 604 can have a second conductivity type. The second conductivity type can be different than the first conductivity type.

In accordance with various embodiments, the threshold voltages of some of the field effect transistors of the first group of field effect transistors 602 can differ from the threshold voltages of some of the field effect transistors of the second group of field effect transistors 604. By way of example, the threshold voltages of some of the field effect transistors of the first group of field effect transistors 602 can differ from the threshold voltages of some of the field effect transistors of the second group of field effect transistors 604 by at least approximately 50 mV to approximately 150 mV.

In accordance with various embodiments, the current-voltage characteristic curves of some of the field effect transistors of the first group of field effect transistors 602 can differ from the current-voltage characteristic curves of some of the field effect transistors of the second group of field effect transistors 604.

In accordance with various embodiments, the transfer characteristic of some of the field effect transistors of the first group of field effect transistors 602 can differ from the transfer characteristic of some of the field effect transistors of the second group of field effect transistors 604.

The field effect transistors of the first group of field effect transistors 602 and the field effect transistors of the second group of field effect transistors 604 can be interconnected to form a NAND-based RS flip-flop, to form a NOR-based RS flip-flop, to form an AND-NOR-based RS flip-flop or to form an OR-NAND-based RS flip-flop.

In accordance with the embodiments illustrated by way of examples in FIG. 6A and 6C, the integrated circuit 600 includes seven field effect transistors provided next to one another in the first group of field effect transistors 602 and seven field effect transistors provided next to one another in the second group of field effect transistors 604. In accordance with various embodiments, each field effect transistor of the seven field effect transistors of the first group of field effect transistors 602 can be an n-channel field effect transistor and/or each field effect transistor of the seven field effect transistors of the second group of field effect transistors 604 can be an n-channel field effect transistor (e.g., FIG 6A). In accordance with various embodiments, each field effect transistor of the seven field effect transistors of the first group of field effect transistors 602 can be a p-channel field effect transistor and/or each field effect transistor of the seven field effect transistors of the second group of field effect transistors 604 can be a p-channel field effect transistor (e.g., FIG. 6C). In accordance with the embodiment illustrated by way of example in FIG. 6A, each field effect transistor of the seven field effect transistors of the first group of field effect transistors 602 is an n-channel field effect transistor and each field effect transistor of the seven field effect transistors of the second group of field effect transistors 604 is an n-channel field effect transistor.

The integrated circuit 600 may include the integrated circuit 500, wherein the seven field effect transistors 502, 504, 506, 508, 510, 512, 514 can form the first group of field effect transistors 602. The source contact 518 can be a first source contact 518. The drain contact 522 can be a first drain contact 522. The input 550 can be a first input 550 (SZ).

The second group of field effect transistors 604 may include seven field effect transistors, for example: an eighth FET 606, a ninth FET 608, a tenth FET 610, an eleventh FET 612, a twelve FET 614, a thirteenth FET 616, and a fourteenth FET 618. As described below, the field effect transistors 606, 608, 610, 612, 614, 616, 618 of the second group of field effect transistors 604 can be similar to the field effect transistors 502, 504, 506, 508, 510, 512, 514 of the first group of field effect transistors 602. The source diffusion region 620 of the eighth FET 606 can be connected to the first source contact 518. The gate terminal of the eighth FET 606 can be connected to the first gate contact 536. The integrated circuit 600 may include an eighth gate contact 622. The eighth gate contact 622 can be connected to the ninth gate terminal of the ninth FET 608. The gate terminal of the tenth FET 610 can be connected to the third gate contact 540. The integrated circuit 600 may include a ninth gate contact 624. The ninth gate contact 624 can be connected to the gate terminal of the eleventh FET 612. The gate terminal of the twelfth FET 614 can be connected to the fifth gate contact 544. The integrated circuit 600 may include a tenth gate contact 626. The tenth gate contact 626 can be connected to the gate terminal of the thirteenth FET 616. The integrated circuit 600 may include an eleventh gate contact 628. The eleventh gate contact 628 can be connected to the gate terminal of the fourteenth FET 618. The eleventh gate contact 628 can furthermore be connected to a second input 630 (SY). The drain diffusion region 632 of the fourteenth FET 618 can be connected to a drain contact 634.

The integrated circuit 600 may furthermore include a fifteenth FET 636. The fifteenth FET 636 can be an n-channel field effect transistor. The source diffusion region of the fifteenth FET 636 can be connected to a second source contact 638. The second source contact 638 can be connected to a low supply potential VSS. The drain diffusion region of the fifteenth FET 636 can be connected to a second drain contact 640. The integrated circuit 600 may include a twelfth gate contact 642 (T0). The twelfth gate contact 642 can be connected to the second drain contact 640. The twelfth gate contact 642 can be connected to the first source contact 518. The twelfth gate contact 642 can be connected to the gate terminal of a sixteenth FET 644. The sixteenth FET 644 can be a p-channel field effect transistor. The source diffusion region of the sixteenth FET 644 can be connected to a third source contact 645. The third source contact 645 can be connected to a high supply potential VDD. The drain diffusion region of the sixteenth FET 644 can be connected to a third drain contact 646. The integrated circuit 600 may include a thirteenth gate contact 648 (T1). The thirteenth gate contact 648 can be connected to the gate terminal of the fifteenth FET 636. The thirteenth gate contact 648 can be connected to the third drain contact 646. The thirteenth gate contact 648 can furthermore be connected to the first gate contact 536.

The integrated circuit 600 may furthermore include a seventeenth FET 650, an eighteenth FET 652, a nineteenth FET 654 and a twentieth FET 656. The seventeenth FET 650, the eighteenth FET 652, the nineteenth FET 654 and/or the twentieth FET 656 can be p-channel field effect transistors. The source diffusion region of the seventeenth FET 650 can be connected to a fourth source contact 658. The source diffusion region of the eighteenth FET 652 can be connected to a fifth source contact 660. The source diffusion region of the nineteenth FET 654 can be connected to a sixth source contact 662. The source diffusion region of the twentieth FET 656 can be connected to a seventh source contact 664. The fourth source contact 658, the fifth source contact 660, the sixth source contact 662 and/or the seventh source contact 664 can be connected to the high supply potential VDD.

The integrated circuit 600 may include a fourteenth gate contact 666. The fourteenth gate contact 666 can be connected to the gate terminal of the seventeenth FET 650. The fourteenth gate contact 666 can be connected to the eleventh gate contact 628.

The seventeenth FET 650 and the eighteenth FET 652 may include a first common drain diffusion region 668. The first common drain diffusion region 668 can be connected to a fourth drain contact 670. The fourth drain contact 670 can be connected to the second drain contact 634. The fourth drain contact 670 can be connected to a second output 672 (YN).

The nineteenth FET 654 and the twentieth FET 656 may include a second common drain diffusion region 674. The second common drain diffusion region 674 can be connected to a fifth drain contact 676. The fifth drain contact 676 can be connected to the first drain contact 522. The fifth drain contact 676 can be connected to a first output 678 (ZN). The fifth drain contact 676 can furthermore be connected to a fifteenth gate contact 680. The fifteenth gate contact 680 can be connected to the gate terminal of the eighteenth FET 652.

The integrated circuit 600 may furthermore include a sixteenth gate contact 682. The sixteenth gate contact 682 can be connected to the gate terminal of the nineteenth FET 654. The sixteenth gate contact 682 can be connected to the seventh gate contact 548. The integrated circuit 600 may include a seventeenth gate contact 684. The seventeenth gate contact 684 can be connected to the gate terminal of the twentieth FET 656. The seventeenth gate contact 684 can be connected to the sixth gate contact 546. The seventeenth gate contact 684 can furthermore be connected to the fourth drain contact 670 (for example by means of a sixth drain contact 686).

Figure 6D:
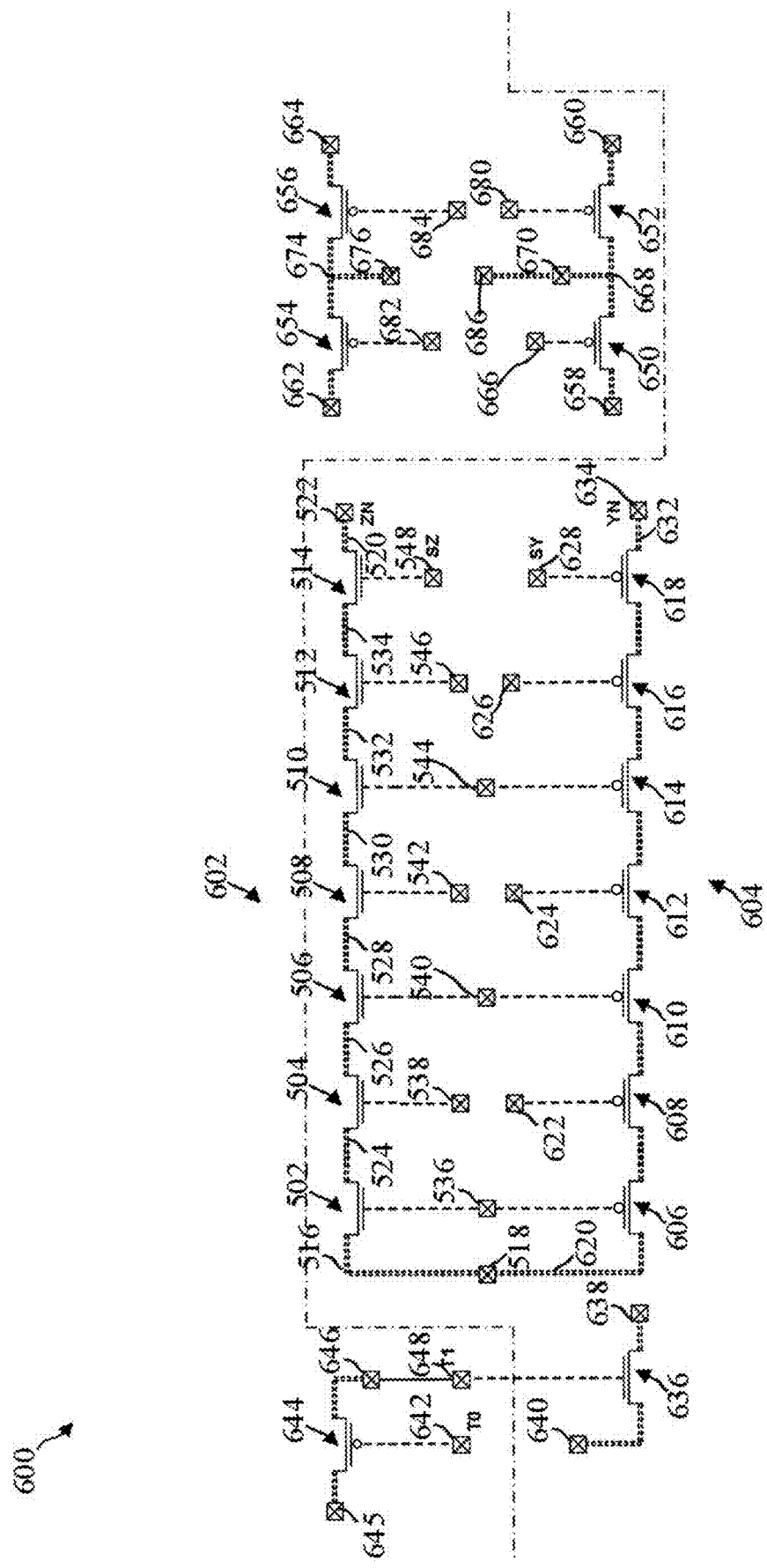
FIG. 6D shows a contact plane of an integrated circuit which realizes a NAND-based RS flip-flop, in accordance with various embodiments.

FIGS. 6B and 6D both show a contact plane of the integrated circuit 600 which realizes a NAND-based RS flip-flop, in accordance with various embodiments.

The contact plane of the integrated circuit 600 can be exposed for example by removal (for example by means of mechanical grinding, chemical etching or physical etching) of layers (for example metal and insulation layers) of the integrated circuit. This may be necessary for example for analyzing properties of the field effect transistors (for example determining threshold voltages).

As described above, the number of necessary examination needles increases with the number of field effect transistors arranged next to one another (for example connected in series) and the number of available examination needles may be limited (for example be limited to a maximum of eight examination needles) on account of various factors. In order to analyze the electronic properties of a field effect transistor of the first group 602 of field effect transistors, it is necessary to contact the first gate contact 536, the second gate contact 538, the third gate contact 540, the fourth gate contact 542, the fifth gate contact 544, the sixth gate contact 546, the seventh gate contact 548, the first source contact 518 and the first drain contact 522 with an examination needle. In order to analyze the electronic properties of a field effect transistor of the second group 604 of field effect transistors, it is necessary to contact the first gate contact 536, the eighth gate contact 622, the third gate contact 540, the ninth gate contact 624, the fifth gate contact 544, the tenth gate contact 626, the eleventh gate contact 628, the first source contact 518 and the second drain contact 634 with an examination needle. Consequently, nine examination needles are necessary in these cases. The number of necessary examination needles may for example be greater than the number of examination needles available (for example commercially) in an apparatus.

Figure 7A:
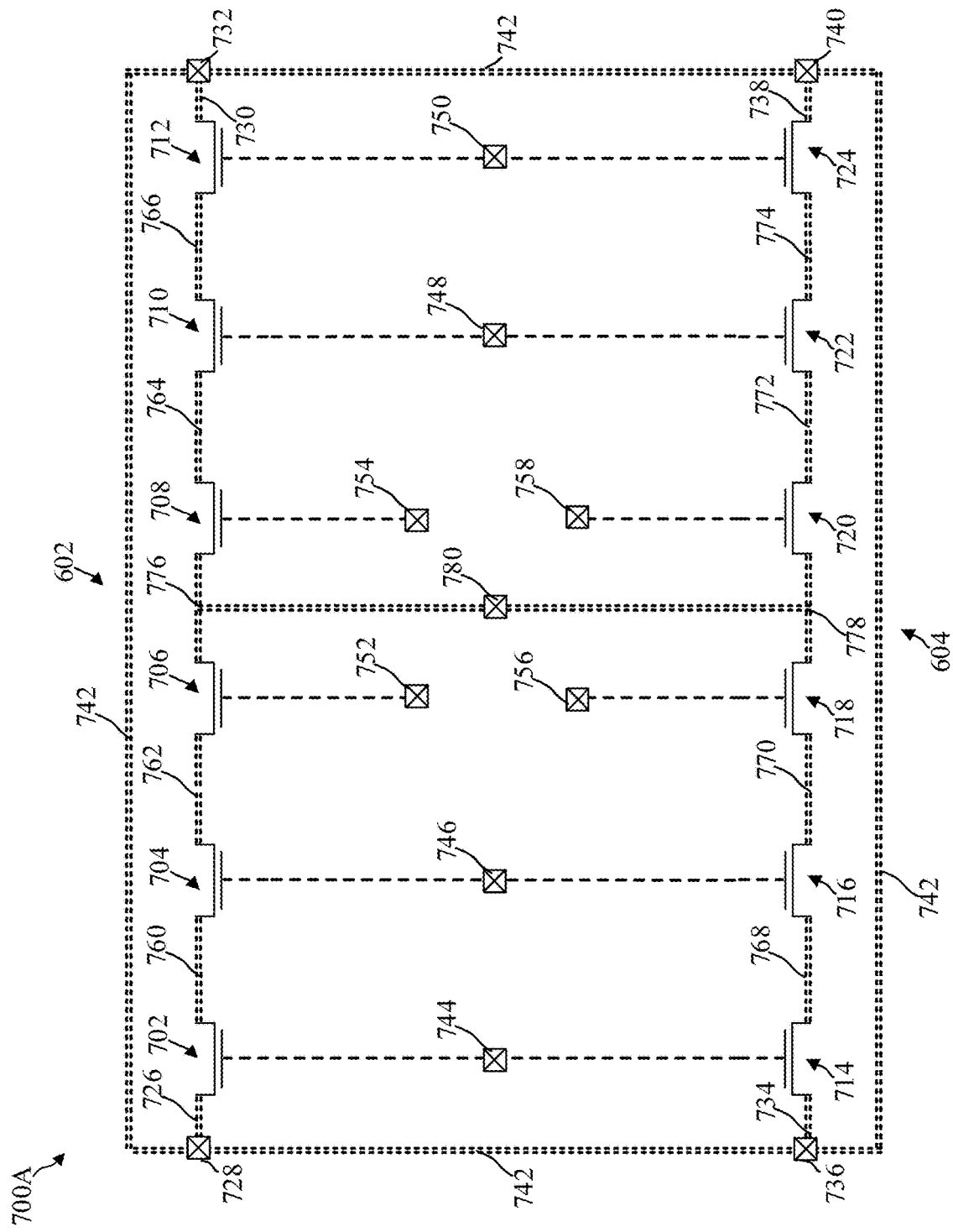
FIG. 7A shows a transistor arrangement of an integrated circuit in accordance with various embodiments.
Figure 7B:
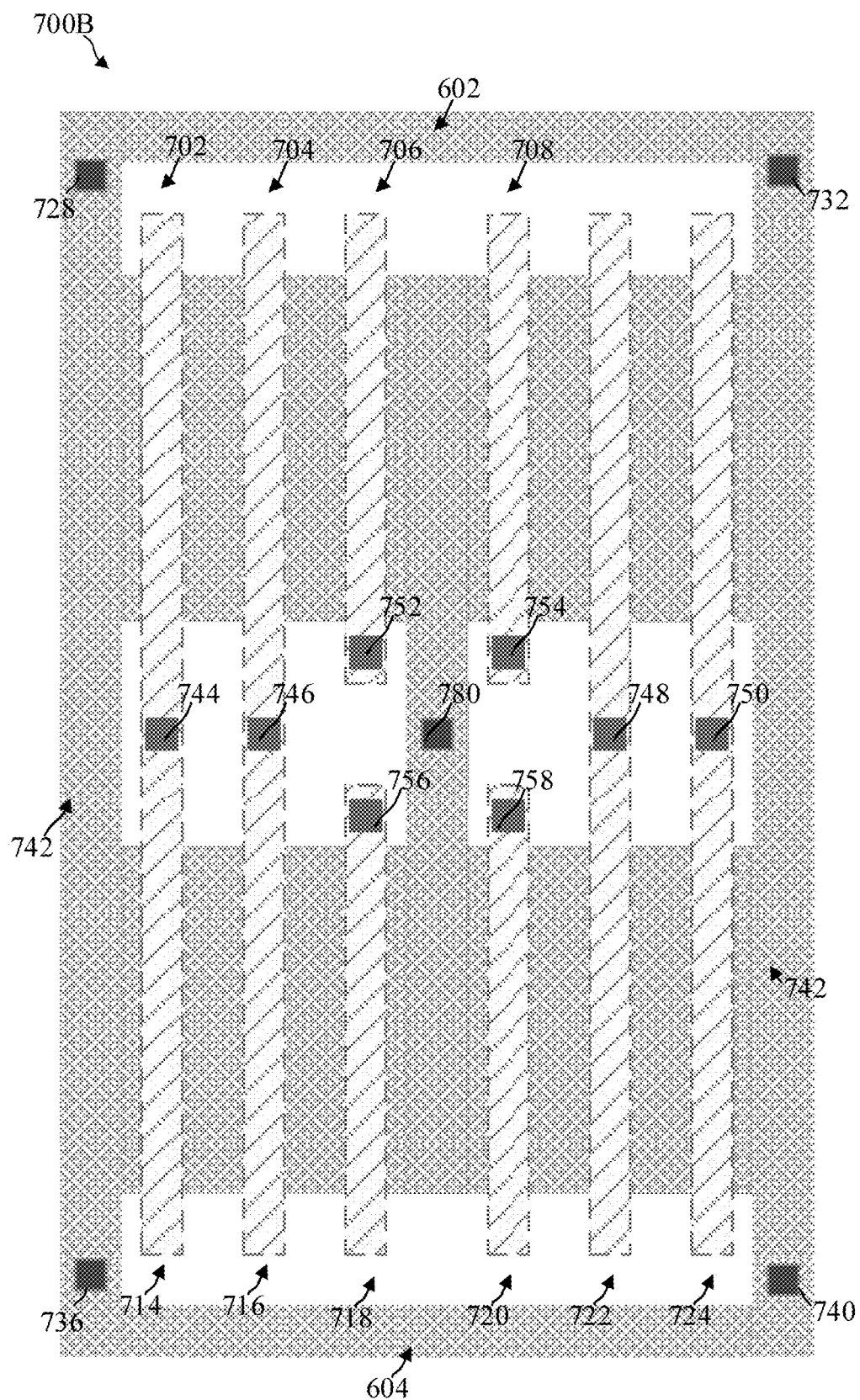
FIG. 7B shows a layout of an integrated circuit in accordance with various embodiments.

FIG. 7A shows a transistor arrangement of an integrated circuit 700A in accordance with various embodiments. FIG. 7B shows a layout 700B of the transistor arrangement of the integrated circuit 700A in accordance with various embodiments. The transistor arrangement of the integrated circuit 700A can be used in the integrated circuit 600, for example.

The integrated circuit 700A may include the plurality of field effect transistors of the first group of field effect transistors 602. The first group of field effect transistors 602 may include a first FET 702, a second FET 704, a third FET 706, a fourth FET 708, a fifth FET 710 and a sixth FET 712. The first FET 702, the second FET 704, the third FET 706, the fourth FET 708, the fifth FET 710 and the sixth FET 712 can be arranged next to one another (for example connected in series and/or parallel).

The integrated circuit 700A may furthermore include the plurality of field effect transistors of the second group of field effect transistors 604. The second group of field effect transistors 604 may include a seventh FET 714, an eighth FET 716, a ninth FET 718, a tenth FET 720, an eleventh FET 722 and a twelfth FET 724. The seventh FET 714, the eighth FET 716, the ninth FET 718, the tenth FET 720, the eleventh FET 722 and the twelfth FET 724 can be arranged next to one another (for example connected in series and/or parallel).

The source diffusion region 726 of the first FET 702 can be connected to a first source contact 728. The source diffusion region 730 of the sixth FET 712 can be connected to a second source contact 732. The source diffusion region 734 of the seventh FET 714 can be connected to a third source contact 736. The source diffusion region 738 of the twelfth FET 724 can be connected to a fourth source contact 740. The first source contact 728, the second source contact 732, the third source contact 736 and/or the fourth source contact 740 can be connected to a common source diffusion region 742.

The integrated circuit 700A may include a first gate contact 744. The first gate contact 744 can be connected to the gate terminal of the first FET 702. The first gate contact 744 can furthermore be connected to the gate terminal of the seventh FET 714. The integrated circuit 700A may include a second gate contact 746. The second gate contact 746 can be connected to the gate terminal of the second FET 704. The second gate contact 746 can furthermore be connected to the gate terminal of the eighth FET 716. The integrated circuit 700A may include a third gate contact 748. The third gate contact 748 can be connected to the gate terminal of the fifth FET 710. The third gate contact 748 can furthermore be connected to the gate terminal of the eleventh FET 722. The integrated circuit 700A may include a fourth gate contact 750. The fourth gate contact 740 can be connected to the gate terminal of the sixth FET 712. The fourth gate contact 750 can furthermore be connected to the gate terminal of the twelfth FET 724.

The integrated circuit 700A may include a fifth gate contact 752. The fifth gate contact 752 can be connected to the gate terminal of the third FET 706. The integrated circuit 700A may include a sixth gate contact 754. The sixth gate contact 754 can be connected to the gate terminal of the fourth FET 708. The integrated circuit 700A may include a seventh gate contact 756. The seventh gate contact 756 can be connected to the gate terminal of the ninth FET 718. The integrated circuit 700A may include an eighth gate contact 758. The eighth gate contact 758 can be connected to the gate terminal of the tenth FET 720.

The first FET 702 and the second FET 704 may include a first common source/drain diffusion region 760. The second FET 704 and the third FET 706 may include a second common source/drain diffusion region 762. The fourth FET 708 and the fifth FET 710 may include a third common source/drain diffusion region 764. The fifth FET 710 and the sixth FET 712 may include a fourth common source/drain diffusion region 766. The seventh FET 714 and the eighth FET 716 may include a fifth common source/drain diffusion region 768. The eighth FET 716 and the ninth FET 718 may include a seventh common source/drain diffusion region 770. The tenth FET 720 and eleventh FET 722 may include a seventh common source/drain diffusion region 772. The eleventh FET 722 and the twelfth FET 724 may include an eighth common source/drain diffusion region 774.

In accordance with various embodiments, the third FET 706 and the fourth FET 708 may include a first common drain diffusion region 776. Furthermore, the ninth FET 718 and the tenth FET 720 may include a second common drain diffusion region 778. The first common drain diffusion region 776 can be connected to a drain contact 780. The drain contact 780 can furthermore be connected to the second common drain diffusion region 778.

In accordance with various embodiments, the drain contact 780 can be arranged between the fifth gate contact 752, the sixth gate contact 754, the seventh gate contact 756 and the eighth gate contact 758. By way of example, the fifth gate contact 752, the sixth gate contact 754, the seventh gate contact 756 and the eighth gate contact 758, illustratively, can be arranged substantially respectively on a corner of a rectangle (for example of a square) and the drain contact 780 can be arranged substantially in the center of the rectangle (for example of the square). The drain contact 780, the fifth gate contact 752, the sixth gate contact 754, the seventh gate contact 756 and the eighth gate contact 758 can be arranged in such a way that they are arranged at a distance from one another that is the minimum that can be realized technologically.

As described above, analyzing properties of a field effect transistor of the first group of field effect transistors 602 or respectively a field effect transistor of the second group of field effect transistors 604 may necessitate contacting the gate contacts of each field effect transistor arranged next to one another in the first group of field effect transistors 602 or respectively in the second group of field effect transistors 604 with an examination needle and furthermore contacting the respective source contact and the respective drain contact. Consequently, it may be necessary to contact the fifth gate contact 752, the sixth gate contact 754 and the drain contact 780 with an examination needle in order to analyze properties of a field effect transistor of the first group of field effect transistors 602, and it may be necessary to contact the seventh gate contact 756, the eighth gate contact 758 and the drain contact 780 with an examination needle in order to detect the electronic properties of a field effect transistor of the second group of field effect transistors 604. The arrangement of the drain contact 780 between the fifth gate contact 752, the sixth gate contact 754, the seventh gate contact 756 and the eighth gate contact 758 has the effect that on account of a minimum size (for example a minimum diameter) of a respective examination needle, it may not be possible to contact the fifth gate contact 752, the sixth gate contact 754 and the drain contact 780 simultaneously with an examination needle or respectively to contact the seventh gate contact 756, the eighth gate contact 758 and the drain contact 780 simultaneously with an examination needle. Illustratively, the examination needles of the same apparatus obstruct one another when contacting the gate contacts and/or the drain contact. This has the effect that an analysis of the electronic properties of a field effect transistor of the first group of field effect transistors 602 and/or of a field effect transistor of the second group of field effect transistors 604 is restricted, for example prevented.

Figure 8:
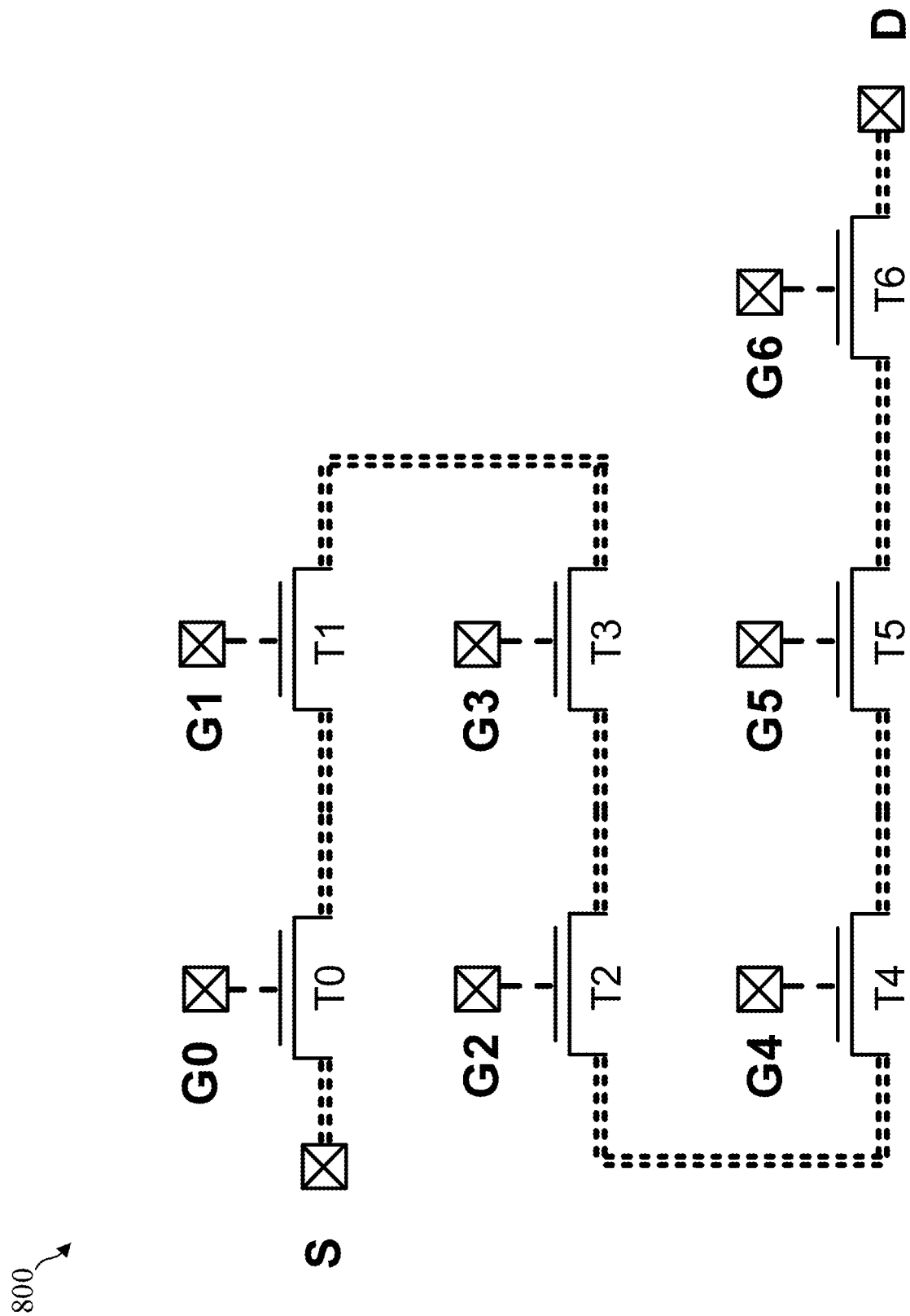
FIG. 8 shows a transistor arrangement of an integrated circuit in accordance with various embodiments.
Figure 9:
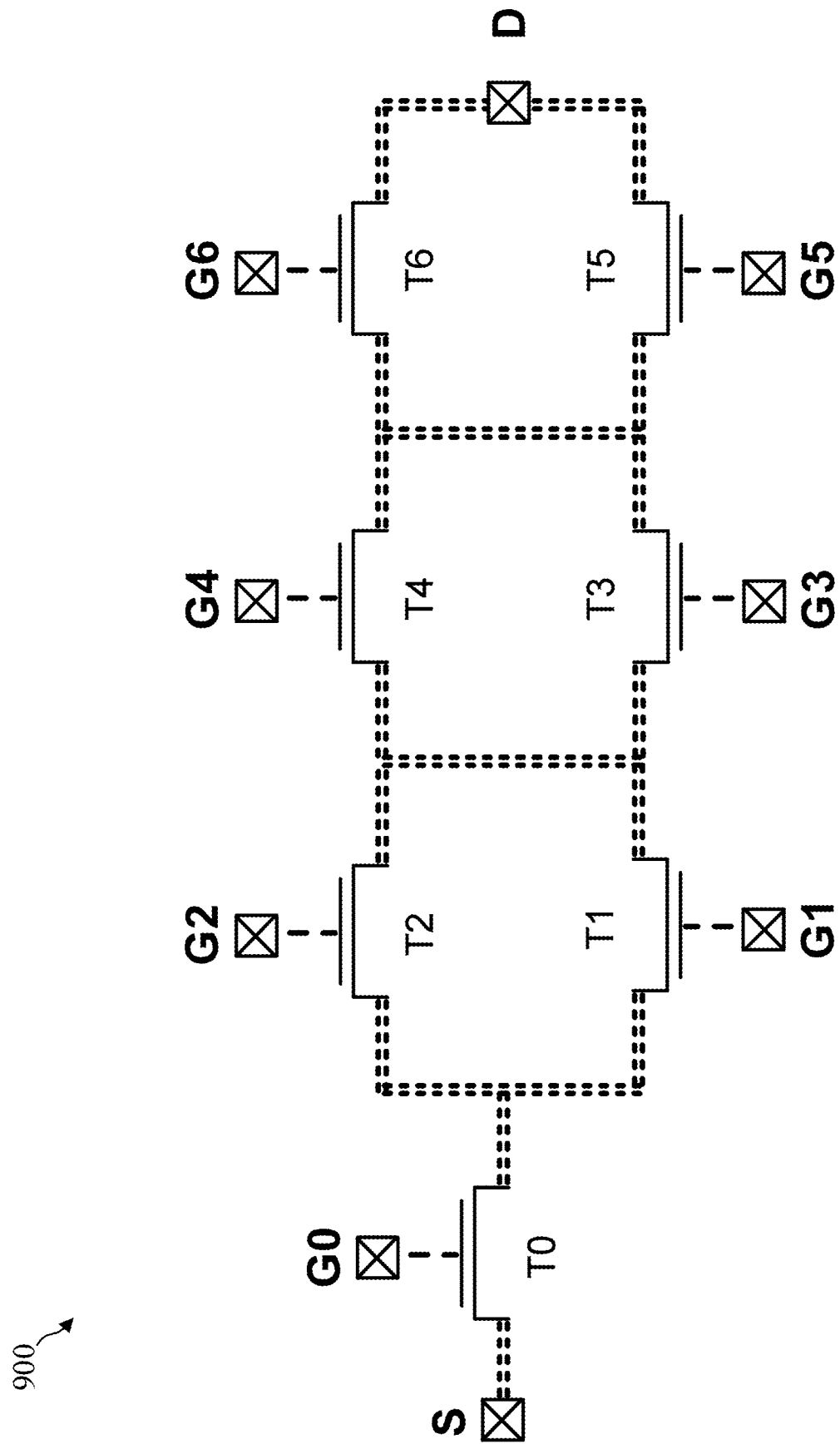
FIG. 9 shows a transistor arrangement of an integrated circuit in accordance with various embodiments.
Figure 10:
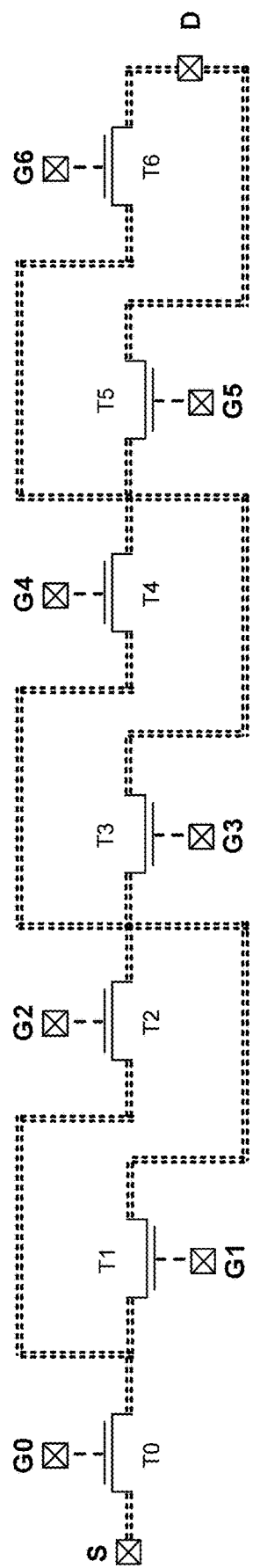
FIG. 10 shows a transistor arrangement of an integrated circuit in accordance with various embodiments.

FIGS. 8 to 10 show various transistor arrangements of integrated circuits 800, 900, 1000 in accordance with various embodiments. The integrated circuits 800, 900, 1000 may include seven field effect transistors T0, T1, T2, T3, T4, T5, T6. The seven field effect transistors T0, T1, T2, T3, T4, T5, T6 can be connected in series and/or in parallel. The seven field effect transistors T0, T1, T2, T3, T4, T5, T6 can be arranged in such a way that no contacts are formed between adjacent field effect transistors. Nine examination needles are necessary for analyzing the electronic properties of a field effect transistor of the seven field effect transistors T0, T1, T2, T3, T4, T5, T6 of the transistor arrangements illustrated in FIGS. 8 to 10.

FIG. 8 shows a transistor arrangement of the integrated circuit 800, wherein the seven field effect transistors T0, T1, T2, T3, T4, T5, T6 are connected in series.

FIG. 9 shows a transistor arrangement of the integrated circuit 900, wherein field effect transistors of the seven field effect transistors T0, T1, T2, T3, T4, T5, T6 are connected in series and wherein field effect transistors of the seven field effect transistors T0, T1, T2, T3, T4, T5, T6 are connected in parallel.

FIG. 10 shows a transistor arrangement of the integrated circuit 1000, wherein field effect transistors of the seven field effect transistors T0, T1, T2, T3, T4, T5, T6 are connected in series and wherein field effect transistors of the seven field effect transistors T0, T1, T2, T3, T4, T5, T6 are connected in parallel.

Figure 11:
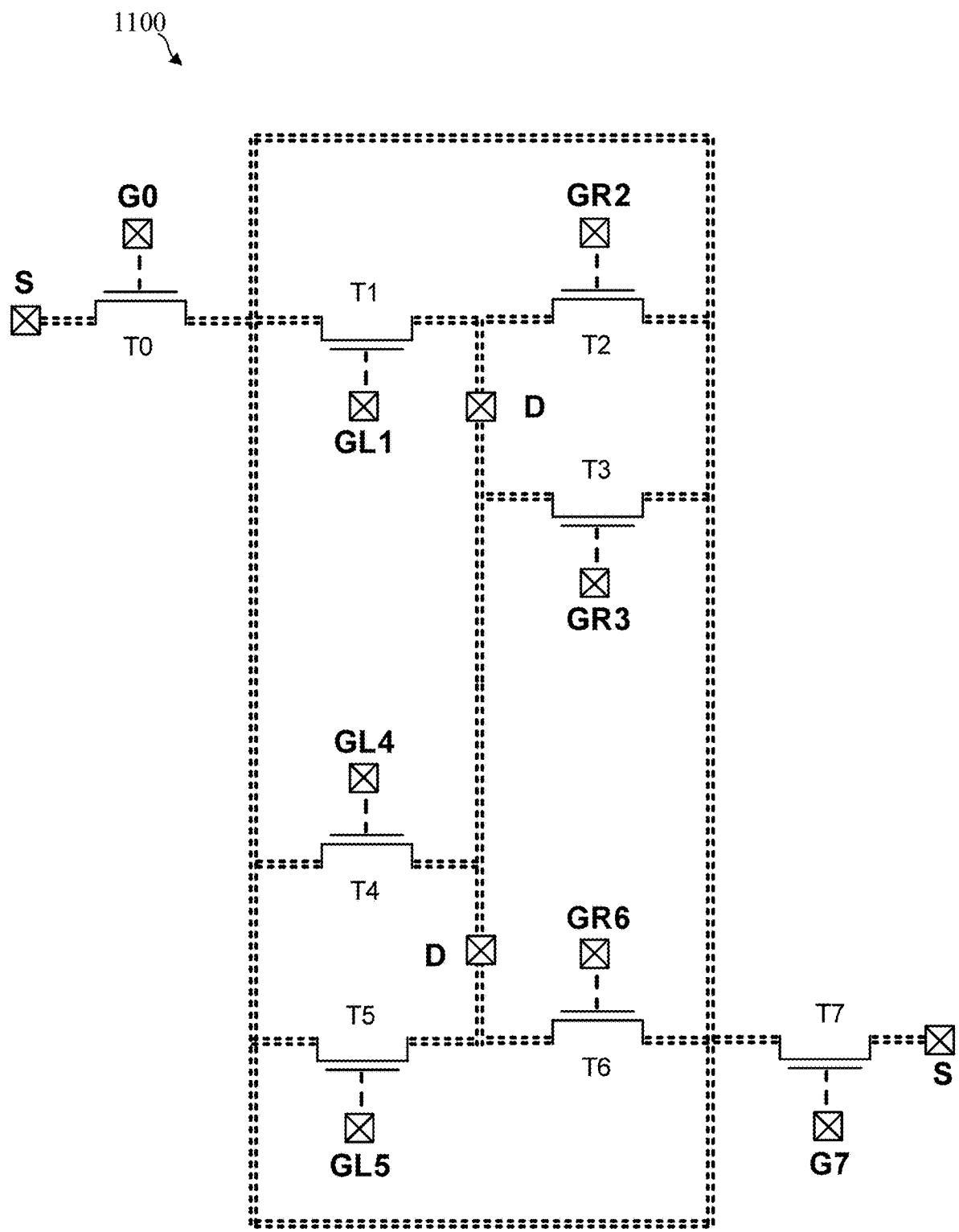
FIG. 11 shows a transistor arrangement of an integrated circuit in accordance with various embodiments.
Figure 12:
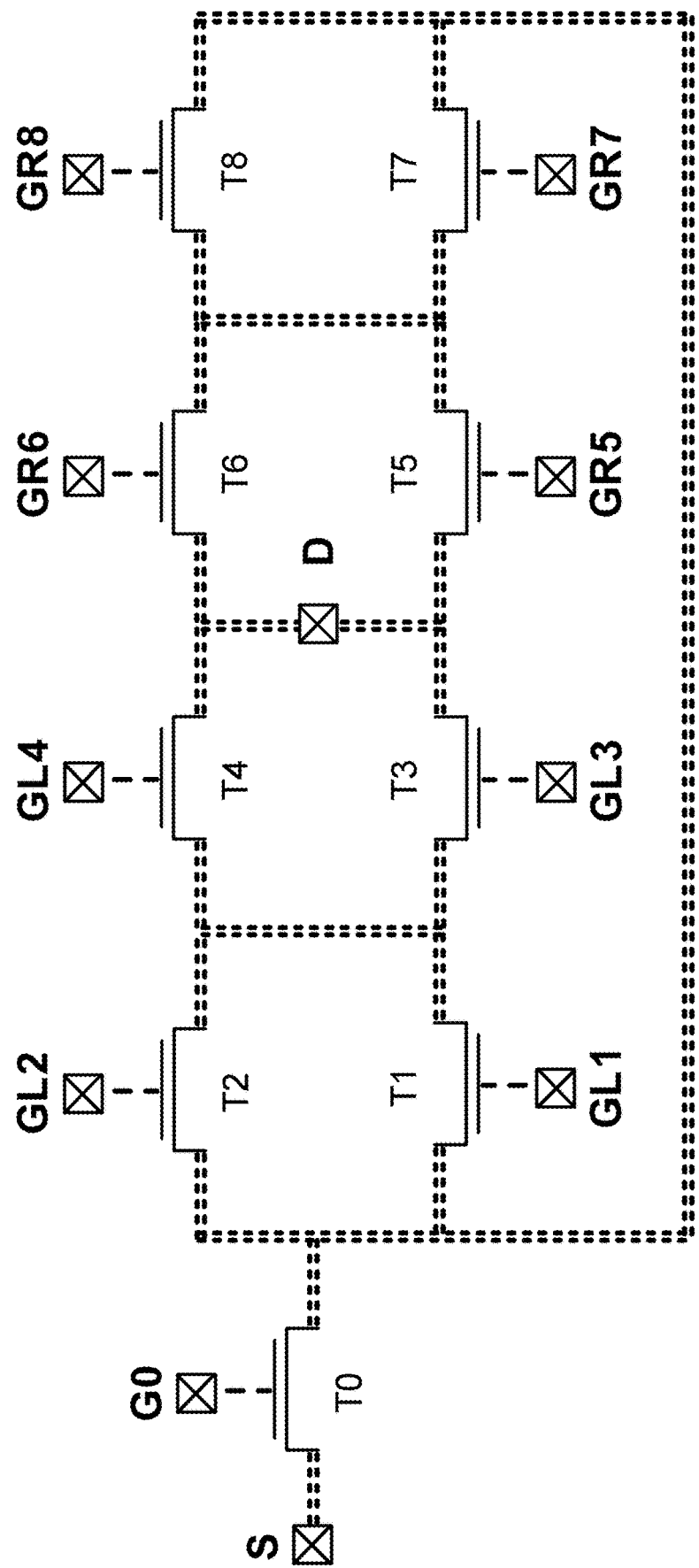
FIG. 12 shows a transistor arrangement of an integrated circuit in accordance with various embodiments.
Figure 13:
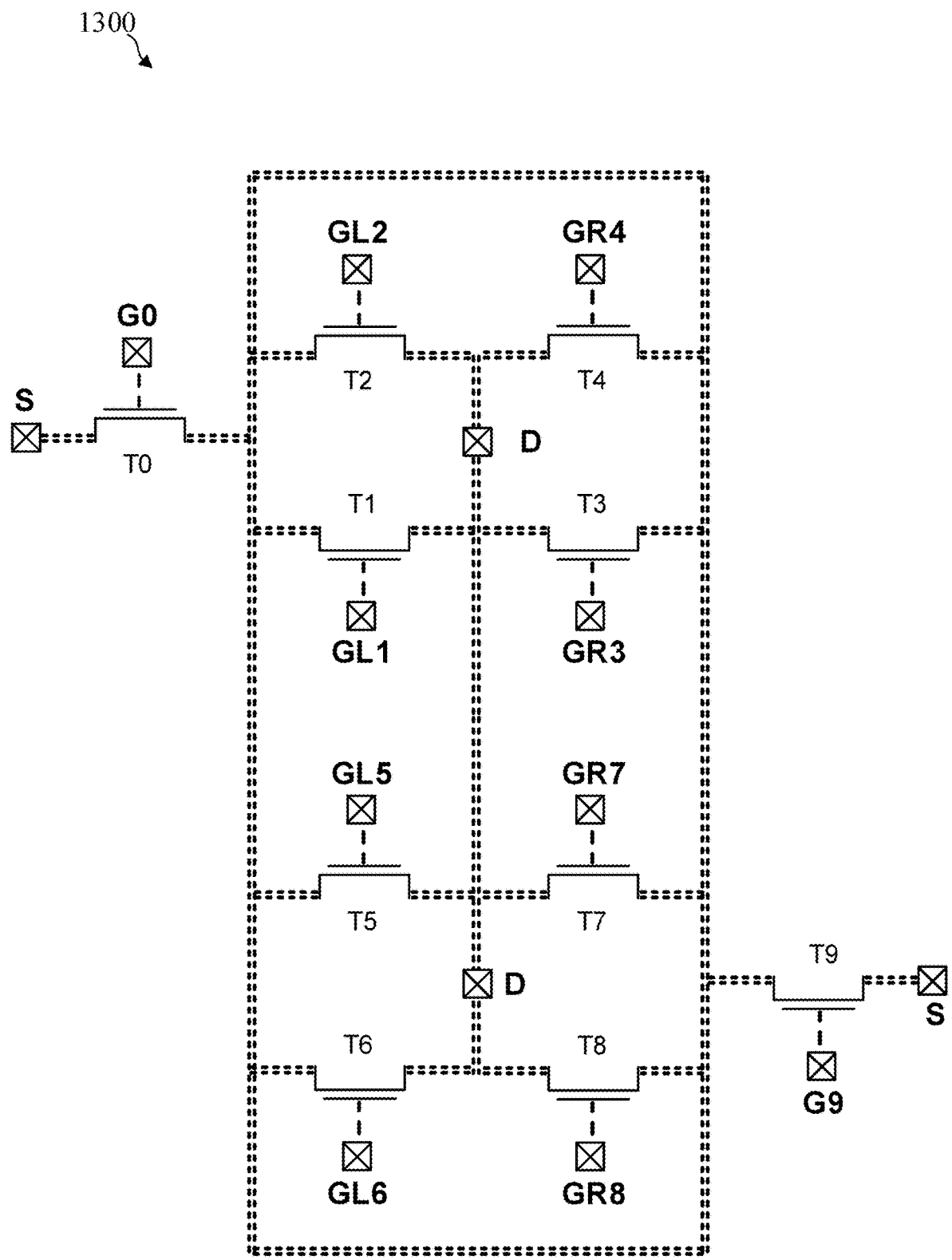
FIG. 13 shows a transistor arrangement of an integrated circuit in accordance with various embodiments.

FIG. 11 shows a transistor arrangement of an integrated circuit 1100 in accordance with various embodiments. The integrated circuit 1100 may include eight field effect transistors T0, T1, T2, T3, T4, T5, T6, T7. FIG. 12 shows a transistor arrangement of an integrated circuit 1200 in accordance with various embodiments. The integrated circuit 1200 may include nine field effect transistors T0, T1, T2, T3, T4, T5, T6, T7, T8. FIG. 13 shows a transistor arrangement of an integrated circuit 1300 in accordance with various embodiments. The integrated circuit 1300 may include ten field effect transistors T0, T1, T2, T3, T4, T5, T6, T7, T8, T9. The field effect transistors T0, T1, T2, T3, T4, T5, T6, T7 (and/or T8, and/or T9) can be connected in series and/or in parallel. The field effect transistors T0, T1, T2, T3, T4, T5, T6, T7 (and/or T8, and/or T9) can be arranged in such a way that no contacts are formed between adjacent field effect transistors. Ten examination needles are necessary for analyzing properties of a field effect transistor of the field effect transistors T0, T1, T2, T3, T4, T5, T6, T7 of the transistor arrangement illustrated in FIG. 11. Eleven examination needles are necessary for analyzing properties of a field effect transistor of the field effect transistors T0, T1, T2, T3, T4, T5, T6, T7, T8 of the transistor arrangement illustrated in FIG. 12. Twelve examination needles of an examination apparatus are necessary for analyzing properties of a field effect transistor of the field effect transistors T0, T1, T2, T3, T4, T5, T6, T7, T8, T9 of the transistor arrangement illustrated in FIG. 13.

Figure 14:
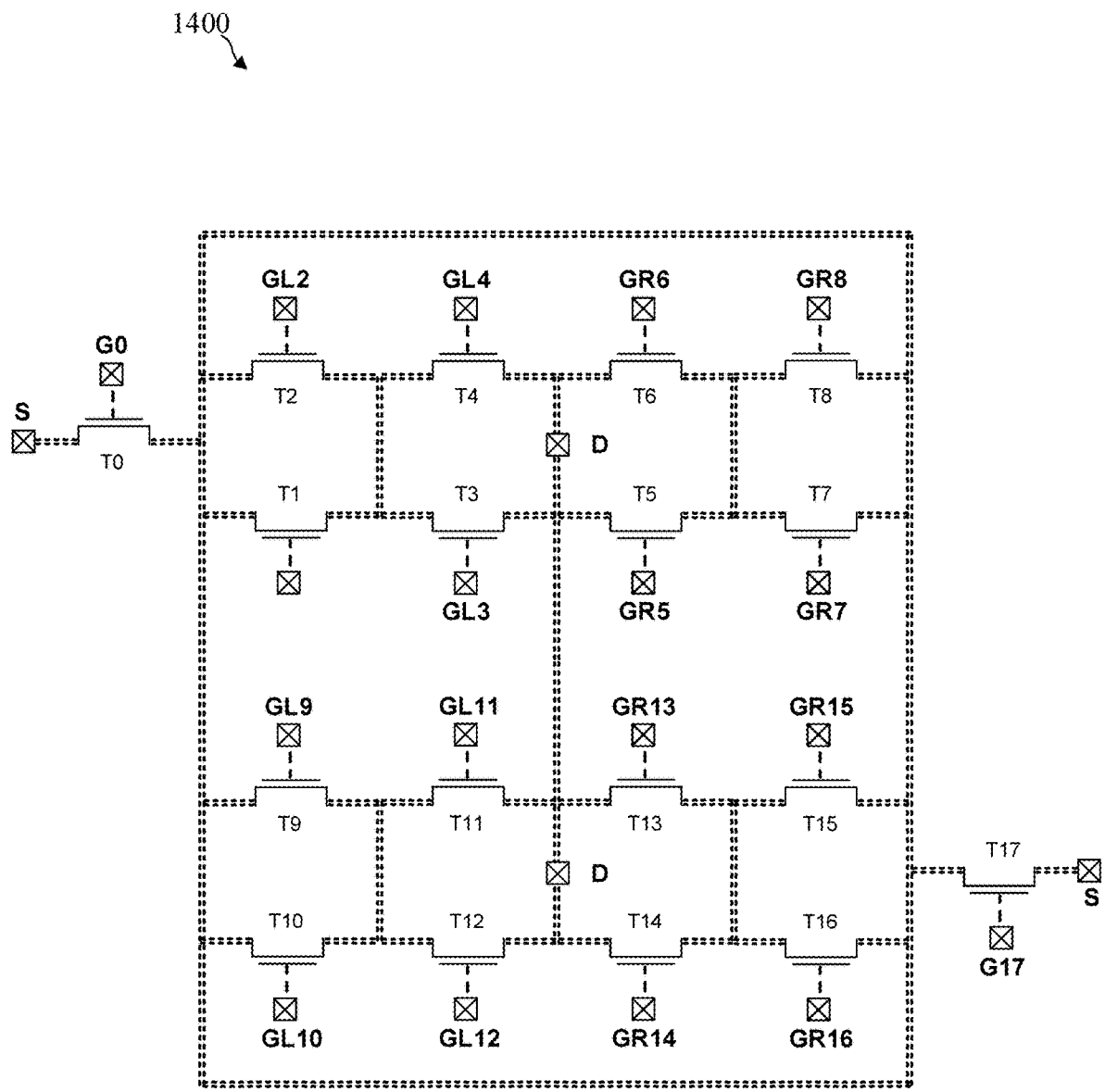
FIG. 14 shows a transistor arrangement of an integrated circuit in accordance with various embodiments.

FIG. 14 shows a transistor arrangement of an integrated circuit 1400 in accordance with various embodiments. The integrated circuit 1400 may include eighteen field effect transistors T0 to T17. The field effect transistors T0 to T17 can be connected in series and/or in parallel. The field effect transistors T0 to T17 can be arranged in such a way that no contacts are formed between adjacent field effect transistors. Twenty examination needles are necessary for analyzing properties of a field effect transistor of the field effect transistors T0 to T17.

In accordance with various embodiments, an integrated circuit may include a multiplicity of field effect transistors, wherein the field effect transistors of the multiplicity of field effect transistors can be connected in series and/or in parallel. The field effect transistors can be arranged in such a way that no contacts are formed between adjacent field effect transistors. This has the effect that, in order to analyze various properties of a field effect transistor, the number of necessary examination needles increases with the number of field effect transistors. In accordance with various embodiments, contacts (such as, for example, gate contacts, drain contacts and/or source contacts) of the integrated circuit can be arranged in such a way that a distance between the contacts is reduced, for example minimized. This has the effect that simultaneous electrical contacting of the contacts in order to detect properties of a field effect transistor is restricted, for example prevented.

Various embodiments provide an integrated circuit by means of which a circuit design can be (physically) obfuscated (for example disguised).

In the course of the reverse engineering of an integrated circuit with the aim of extracting the circuit design, it may be necessary, for example, to analyze properties of switching elements. Therefore, hindering, for example preventing, the analyzing may necessitate hindering, for example preventing, determination of transistor transfer properties.

The integrated circuit which is described herein in accordance with various embodiments can hinder, for example prevent, by way of example the analyzing of properties of switching elements of the integrated circuit. By way of example, an analysis of subcircuits of the integrated circuit can be prevented since illustratively the integrated circuit is not divisible in a meaningful way with regard to an analysis of the switching elements.

In accordance with various embodiments, an integrated circuit may include for example: at least seven planar field effect transistors provided in a common substrate next to one another with a maximum feature size in accordance with a technology node of a maximum of 65 nm. Each field effect transistor of the at least seven planar field effect transistors may include for example a first source/drain diffusion region, a second source/drain diffusion region, a channel region between the drain diffusion region and the source diffusion region, and a gate terminal. Furthermore, for example each field effect transistor of the at least seven planar field effect transistors include at least one common source/drain diffusion region with another field effect transistor of the at least seven planar field effect transistors, wherein the common source/drain diffusion regions can be free of vertical terminal contact material.

A technology node can relate to an architecture of an integrated circuit. A technology node can specify a smallest possible feature size, for example. The smallest possible feature size can relate for example to the smallest possible distance between two structural elements. A technology node can be for example technology nodes having a smallest possible feature size of 1 μm, 800 nm, 600 nm, 350 nm, 250 nm, 180 nm, 130 nm, 90 nm, 65 nm, 45 nm, 32 nm, 22 nm, 14 nm, 10 nm, 7 nm, 5 nm etc.

An integrated circuit of a first example may include at least seven planar field effect transistors provided in a common substrate next to one another in a maximum feature size in accordance with a technology node of a maximum of 65 nm. Each field effect transistor of the at least seven planar field effect transistors includes a first source/drain diffusion region, a second source/drain diffusion region, a channel region between the drain diffusion region and the source diffusion region, and a gate terminal. Each field effect transistor of the at least seven planar field effect transistors includes at least one common source/drain diffusion region with another field effect transistor of the at least seven planar field effect transistors. The common source/drain diffusion regions are free of vertical terminal contact material.

Two field effect transistors of the at least seven planar field effect transistors may each include a source/drain diffusion region with a vertical terminal connected thereto and composed of vertical terminal contact material for electrically contacting the respective source/drain diffusion region. This has the effect that the common source/drain diffusion regions of the other field effect transistors of the at least seven planar field effect transistors can be contacted indirectly by means of the two vertical terminals. The feature described in this paragraph in combination with the first example forms a second example.

A vertical terminal can be any type of connection which can connect (for example electrically connect) semiconductor elements in different planes (such as, for example, in different metallization planes) of an integrated circuit. A vertical terminal can be embodied substantially vertically. A vertical terminal may include a through contact (for example a contact consisting of metal or a metal alloy), such as, for example, contacts to source/drain terminals of MOSFETs (contacting to metal 1 through the insulation layer lying between source/drain and metal 1). The gate terminal of each field effect transistor of the at least seven planar field effect transistors may include a vertical terminal connected thereto and composed of vertical terminal contact material for electrically contacting the respective gate terminal. This has the effect that the gate terminal of each field effect transistor of the at least seven field effect transistors can be individually electrically contacted (for example individually driven). The feature described in this paragraph in combination with the first example or the second example forms a third example.

The vertical terminal contact material may include or substantially consist of a metal or a metal alloy. The features described in this paragraph in combination with one or more of the first example to the third example form a fourth example.

The at least seven planar field effect transistors can form a first group of field effect transistors. The integrated circuit may furthermore include a second group of field effect transistors having at least seven planar field effect transistors. At least some of the planar field effect transistors of the first group of field effect transistors can have a different nominal transconductance than at least some of the planar field effect transistors of the second group of field effect transistors. This has the effect that the field effect transistors of the first group of field effect transistors and the field effect transistors of the second group of field effect transistors can be interconnected to form a logic circuit. The features described in this paragraph in combination with one or more of the first example to the fourth example form a fifth example.

The planar field effect transistors of the first group of field effect transistors can be field effect transistors of a first conductivity type. Some of the planar field effect transistors of the second group of field effect transistors can be field effect transistors of a second conductivity type. The second conductivity type can be different than the first conductivity type. The features described in this paragraph in combination with the fifth example form a sixth example.

The threshold voltages of some of the planar field effect transistors of the first group of field effect transistors can differ from the threshold voltages of some of the planar field effect transistors of the second group of field effect transistors, for example by at least approximately 50 mV to approximately 150 mV. The features described in this paragraph in combination with the fifth example or the sixth example form a seventh example.

The current-voltage characteristic curves of some of the planar field effect transistors of the first group of field effect transistors can differ from the current-voltage characteristic curves of some of the planar field effect transistors of the second group of field effect transistors. The feature described in this paragraph in combination with one or more of the fifth example to the seventh example forms an eighth example.

The transfer characteristic of some of the planar field effect transistors of the first group of field effect transistors can differ from the transfer characteristic of some of the planar field effect transistors of the second group of field effect transistors. The feature described in this paragraph in combination with one or more of the fifth example to the eighth example forms a ninth example.

The at least seven planar field effect transistors can form a NAND-based circuit, a NOR-based circuit, an AND/NOR-based circuit or an OR-NAND-based circuit. The features described in this paragraph in combination with one or more of the first example to the ninth example form a tenth example.

The at least seven planar field effect transistors can be part of a flip-flop, for example of an RS flip-flop. This has the effect that at least two of the at least seven planar field effect transistors have substantially identical transfer properties (for example transconductance). The feature described in this paragraph in combination with one or more of the first example to the tenth example forms an eleventh example.

The at least seven planar field effect transistors can be part of a NAND-based RS flip-flop, of a NOR-based RS flip-flop, of an AND-NOR-based RS flip-flop or of an OR-NAND-based RS flip-flop. The features described in this paragraph in combination with the tenth example and the eleventh example form a twelfth example.

The planar field effect transistors of the first group of field effect transistors and the planar field effect transistors of the second group of field effect transistors can be interconnected to form a NAND-based RS flip-flop, to form a NOR-based RS flip-flop, to form an AND-NOR-based RS flip-flop or to form an OR-NAND-based RS flip-flop. The features described in this paragraph in combination with one or more of the fifth example to the twelfth example form a thirteenth example.

The field effect transistors of the first group of field effect transistors can be metal oxide semiconductor (MOS) field effect transistors. The features described in this paragraph in combination with one or more of the fifth example to the thirteenth example forms a fourteenth example.

The field effect transistors of the second group of field effect transistors can be metal oxide semiconductor (MOS) field effect transistors. The feature described in this paragraph in combination with one or more of the fifth example to the fourteenth example forms a fifteenth example.

The substrate may include or substantially consist of a semiconductor material or a semiconductor composite material. The feature described in this paragraph in combination with one or more of the fifth example to the fifteenth example forms a sixteenth example.

The substrate may include or substantially consist of a semiconductor material or a semiconductor composite material which is selected from a group of materials consisting of: silicon, silicon carbide, gallium arsenide, gallium nitride. The features described in this paragraph in combination with the sixteenth example form a seventeenth example.

The integrated circuit may furthermore include one or more metallization planes for electrically contacting the field effect transistors contained in the substrate by means of contact vias composed of vertical terminal contact material. The features described in this paragraph in combination with one or more of the fifth example to the seventeenth example form an eighteenth example.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
   seven planar field effect transistors provided in a common substrate next to one another, wherein the seven planar field effect transistors are connected in series with one another;
   wherein each field effect transistor of the seven planar field effect transistors comprises a first source/drain diffusion region, a second source/drain diffusion region, a channel region between the first source/drain diffusion region and the second source/drain diffusion region, and a gate terminal;
   wherein each field effect transistor of the seven planar field effect transistors comprises at least one common source/drain diffusion region with another field effect transistor of the seven planar field effect transistors and wherein, in the at least one common source/drain diffusion region, a drain of a first transistor and a source of a second transistor, adjacent to the first transistor, share a conductor common to both the drain of the first transistor and the source of the second transistor;
   wherein any common source/drain diffusion regions defined by the first source/drain diffusion region and the second source/drain diffusion region are free of vertical terminal contact material;
   wherein the gate terminal of each field effect transistor of the seven planar field effect transistors comprises a vertical terminal connected thereto and composed of vertical terminal contact material for electrically contacting the respective gate terminal;
   further comprising a first gate group, in which gates of at least two planar field effect transistors of the seven planar field effect transistors are connected via a first common conductor, and a second gate group, in which gates of at least two other planar field effect transistors of the seven planar field effect transistors are connected via a second common conductor, different from the first common conductor.

2. The integrated circuit of claim 1,
   wherein two field effect transistors of the seven planar field effect transistors each comprise a source/drain diffusion region with a vertical terminal connected thereto and composed of vertical terminal contact material for electrically contacting the respective source/drain diffusion region.

3. The integrated circuit of claim 1,
   wherein the vertical terminal contact material comprises a metal or a metal alloy.

4. The integrated circuit of claim 1,
   wherein the seven planar field effect transistors form a first group of field effect transistors;
   wherein the integrated circuit furthermore comprises a second group of field effect transistors comprising seven planar field effect transistors;
   wherein at least two of the planar field effect transistors of the first group of field effect transistors have a different transconductance than at least two of the planar field effect transistors of the second group of field effect transistors.

5. The integrated circuit of claim 4,
   wherein the planar field effect transistors of the first group of field effect transistors are field effect transistors of a first conductivity type;
   wherein at least some of the planar field effect transistors of the second group of field effect transistors are field effect transistors of a second conductivity type, which is different than the first conductivity type.

6. The integrated circuit of claim 4,
   wherein at least two threshold voltages of the planar field effect transistors of the first group of field effect transistors differ from at least two threshold voltages of the planar field effect transistors of the second group of field effect transistors by at least approximately 50 mV to approximately 150 mV.

7. The integrated circuit of claim 4,
   wherein the planar field effect transistors of the first group of field effect transistors and the planar field effect transistors of the second group of field effect transistors are interconnected to form a NAND-based RS flip-flop, to form a NOR-based RS flip-flop, to form an AND-NOR-based RS flip-flop or to form an OR-NAND-based RS flip-flop.

8. The integrated circuit of claim 4,
   wherein the field effect transistors of the first group of field effect transistors are metal oxide semiconductor (MOS) field effect transistors.

9. The integrated circuit of claim 4,
   wherein the field effect transistors of the second group of field effect transistors are metal oxide semiconductor (MOS) field effect transistors.

10. The integrated circuit of claim 4,
wherein the substrate comprises a semiconductor material or a semiconductor composite material.

11. The integrated circuit of claim 10,
wherein the substrate comprises a semiconductor material or a semiconductor composite material which is selected from a group of materials consisting of:
silicon;
silicon carbide;
gallium arsenide; and
gallium nitride.

12. The integrated circuit of claim 1,
wherein the seven planar field effect transistors form a part of a NAND-based circuit, a NOR-based circuit, an AND/NOR-based circuit or an OR-NAND-based circuit.

13. The integrated circuit of claim 12,
wherein the seven planar field effect transistors are part of a NAND-based RS flip-flop, of a NOR-based RS flip-flop, of an AND-NOR-based RS flip-flop or of an OR-NAND-based RS flip-flop.

* * * * *